United States Patent [19]

Matsuzawa et al.

[11] Patent Number: 5,781,278
[45] Date of Patent: Jul. 14, 1998

[54] PROJECTION OPTICAL SYSTEM AND EXPOSURE APPARATUS WITH THE SAME

[75] Inventors: Hitoshi Matsuzawa, Tokyo; Yutaka Suenaga, Yokohama; Misako Kobayashi, Tokyo, all of Japan

[73] Assignee: Nikon Corporation, Tokyo, Japan

[21] Appl. No.: 901,681

[22] Filed: Jul. 28, 1997

Related U.S. Application Data

[63] Continuation of Ser. No. 656,471, May 31, 1996, abandoned.

[30] Foreign Application Priority Data

Apr. 25, 1996 [JP] Japan ................................ 8-105707

[51] Int. Cl.⁶ ........................... G02B 9/62; G03B 27/42; G03B 27/44
[52] U.S. Cl. .................. 355/53; 355/54; 359/757; 359/755
[58] Field of Search ................. 355/53, 54; 359/757, 359/755

[56] References Cited

U.S. PATENT DOCUMENTS

| | | |
|---|---|---|
| 3,909,115 | 9/1975 | Kano . |
| 4,653,876 | 3/1987 | Yamagata .......................... 350/463 |
| 4,666,273 | 5/1987 | Shimizu et al. . |
| 4,702,568 | 10/1987 | Okudaira .......................... 359/755 |
| 4,770,477 | 9/1988 | Shafer . |
| 4,772,107 | 9/1988 | Friedman . |
| 4,811,055 | 3/1989 | Hirose . |
| 4,891,663 | 1/1990 | Hirose . |
| 4,977,426 | 12/1990 | Hirose . |
| 5,105,075 | 4/1992 | Ohta et al. . |
| 5,172,275 | 12/1992 | DeJager .......................... 359/755 |
| 5,260,832 | 11/1993 | Togino et al. . |
| 5,404,247 | 4/1995 | Cobb et al. .......................... 359/755 |
| 5,513,046 | 4/1996 | Toyama .......................... 359/757 |
| 5,557,472 | 9/1996 | Ito et al. .......................... 359/755 |
| 5,557,473 | 9/1996 | Sugiyama et al. .......................... 359/757 |
| 5,572,364 | 11/1996 | Toide et al. .......................... 359/755 |
| 5,589,988 | 12/1996 | Suenaga .......................... 359/752 |

FOREIGN PATENT DOCUMENTS 5-173065  7/1993  Japan .

*Primary Examiner*—R. L. Moses
*Assistant Examiner*—Shival Virmani
*Attorney, Agent, or Firm*—Foley & Lardner

[57] ABSTRACT

The present invention relates to a both-side telecentric projection optical system and an exposure apparatus equipped with this projection optical system. In particular, the projection optical system has a structure for quite favorably correcting various kinds of aberration such as distortion in particular, while securing a relatively broad exposure area and a large numerical aperture.

67 Claims, 9 Drawing Sheets

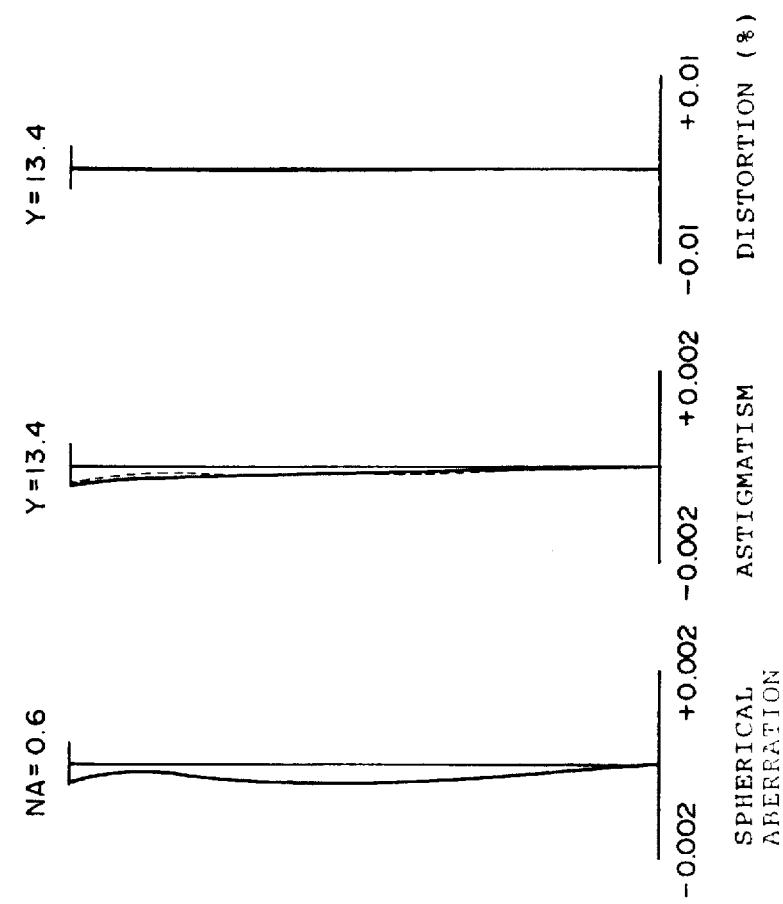

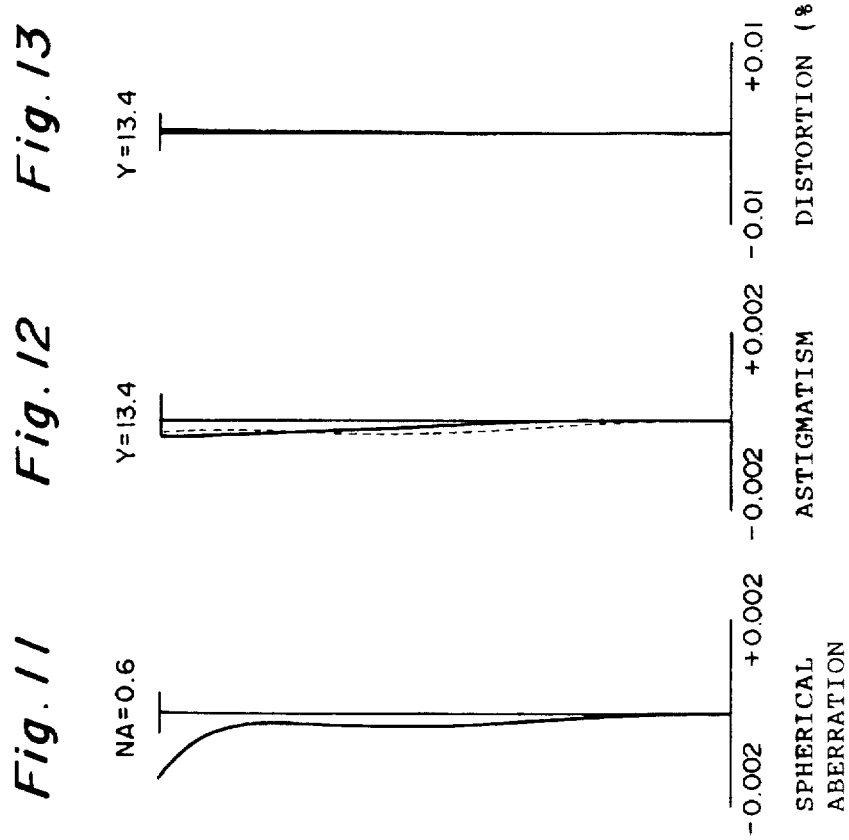

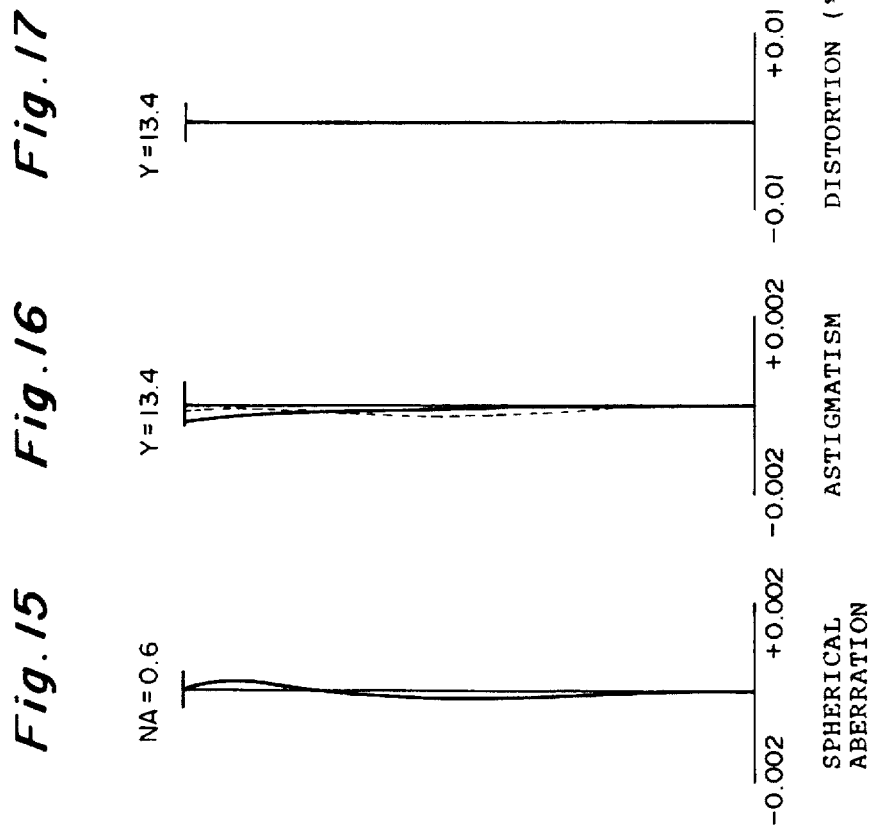

5,781,278

1

PROJECTION OPTICAL SYSTEM AND EXPOSURE APPARATUS WITH THE SAME

This application is a continuation, of application Ser. No. 08/656,471, filed May 31, 1996, now abandoned.

BACKGROUND OF THE INVENTION

1. Field of the Invention

The present invention relates to a projection optical system for projecting an image of a pattern on a first object onto a substrate or the like as a second object. More particularly, the invention concerns a projection optical system suitably applicable for projection-exposing a pattern for semiconductor or for liquid crystal formed on a reticle (or mask) as a first object onto a substrate (silicon wafer, glass plate, or the like) as a second object.

2. Related Background Art

As patterns of integrated circuits become finer and finer, higher performance is being demanded for the projection optical system used for printing onto the wafer. Under such circumstances, resolving power of projection optical system can be conceivably improved by using shorter exposure wavelength λ or increasing the numerical aperture (NA) of projection optical system.

In order to meet the demands to make transfer patterns finer, a light source for exposure is changing recently from one for emitting light of exposure wavelength of the g-line (436 nm) to one for emitting light of exposure wavelength of the i-line (365 nm), which is mainly used these years. Further, light sources for emitting light of further shorter wavelengths, for example excimer lasers (248 nm, 193 nm), are being used as a light source for exposure.

There are proposed projection optical systems for projection-printing patterns on the reticle onto the wafer with light of the above various exposure wavelengths.

The projection optical systems are demanded to decrease image distortion as well as to improve the resolving power. Here, the image distortion is caused by distortion due to the projection optical system, warpage of the wafer to be printed on the image side of projection optical system, warpage of the reticle with circuit patterns or the like, written thereon on the object side of projection optical system, or the like.

Recent further progress in micronizing the transfer patterns is making stronger the demand to decrease the image distortion.

In order to decrease influence of the wafer warpage on the image distortion, a so-called image-side telecentric optical system has been used heretofore, which locates the image-side exit pupil of projection optical system far away from the image plane (on the wafer).

On the other hand, in order to decrease the image distortion due to the reticle warpage, it is considered to use a so-called object-side telecentric optical system, which locates the entrance-pupil of projection optical system far away from the object plane (on the reticle). The prior art for locating the entrance pupil of projection optical system relatively far away from the object plane is disclosed, for example, in Japanese Laid-open Patent Applications No. 63-118115, No. 4-157412, and No. 5-173065.

SUMMARY OF THE INVENTION

Among the above-mentioned optical systems, so-called both-side telecentric projection optical systems, in which both object side (reticle side) and image side (substrate side) are telecentric, are disclosed. However, having studied these conventional both-side telecentric projection optical systems, the inventors have found that the properties of the optical systems are insufficient for satisfying the above-mentioned demand for finer integrated circuits and the like in terms of their numerical aperture (N.A.) size contributing to resolution and function for correcting various kinds of aberration such as distortion in particular.

Accordingly, the object of the present invention is to provide a high-performance both-side telecentric projection optical system which has a compact structure while securing a broad exposure area and a large numerical aperture as well as an exposure apparatus equipped with such a projection optical system. Here, this projection optical system has a structure which can quite favorably correct various kinds of aberration such as distortion in particular. Also, as an exposure apparatus to which this projection optical system is applicable, a one-shot exposure type exposure apparatus or a scanning type exposure apparatus, in which a mask and a substrate are relatively movable with respect to the projection optical system, has been known in general.

In order to achieve the above-mentioned object, the exposure apparatus according to the present invention comprises, at least, a first stage allowing a mask (first object) having a predetermined pattern such as an integrated circuit to be held on a main surface thereof; a second stage capable of holding, on its main surface, a photosensitive substrate (second object) upon which the pattern of the mask is to be printed; an illumination optical system for illuminating the mask with exposure light having a predetermined wavelength; and a projection optical system provided between the first and second stages and used for projecting the predetermined pattern on the mask onto the substrate. In this specification, "photosensitive substrate" refers to a substrate such as silicon wafer or glass plate whose surface is coated with a material such as resist having a photosensitivity with respect to the exposure light.

In particular, as shown in FIG. 1, the exposure apparatus according to the present invention comprises a first lens group $G_1$ with a positive refracting power provided between the above-mentioned first object R and second object W, a second lens group $G_2$ with a negative refracting power provided between the first lens group $G_1$ and the second object W, a third lens group $G_3$ with a positing refracting power provided between the second lens group $G_2$ and the second object W, a fourth lens group $G_4$ with a negative refracting power provided between the third lens group $G_3$ and the second object W, a fifth lens group $G_5$ with a positive refracting power provided between the fourth lens group $G_4$ and the second object W, and a sixth lens group $G_6$ with a positive refracting power provided between the fifth lens group $G_5$ and the second object W.

The first lens group $G_1$ having a positive refracting power mainly contributes to correction of distortion while maintaining telecentricity. Specifically, the first lens group $G_1$ generates positive distortion so as to correct, in a well-balanced manner, negative distortion generated by a plurality of the lens groups placed between the first lens group G. and the second object W. The second lens group $G_2$ having a negative refracting power and the fourth lens group $G_4$ having a negative refracting power mainly contribute to correction of Petzval sum in order to flatten the image surface. The second lens group $G_2$ having a negative refracting power and the third lens group $G_3$ having a positive refracting power constitute an inverted telescopic system. This inverted telescopic system partakes in securing back-focus of the projection optical system (distance from the optical surface such as a lens surface which is closest to the second object in the projection optical system to the second object W). The fifth lens group $G_5$ having a positive refracting power and the sixth lens group $G_6$ similarly having a positive refracting power partake in suppressing generation of distortion. In particular, these lens groups $G_5$ and $G_6$ function to minimize generation of spherical aberration in order to sufficiently respond to a higher N.A. on the second object side.

Further, the above-mentioned second lens group $G_2$ comprises a front lens $L_{2F}$ with a negative refracting power located as closest to the first object R and shaped with a concave surface to the second object W, a rear lens $L_{2R}$ with a negative refracting power located as closest to the second object W and shaped with a concave surface to the first object R, and an intermediate lens group $G_{2M}$ placed between the front lens $L_{2F}$ and the rear lens $L_{2R}$.

According to the configuration mentioned above, the front lens $L_{2F}$ with a negative refracting power, which is located as closest to the first object R and shaped with a concave surface to the second object W, contributes to correction of curvature of field and coma, while the rear lens $L_{2R}$ with a negative refracting power, which is located as closest to the second object W and shaped with a concave surface to the first object R, mainly contributes to correction of coma. Here, the rear lens $L_{2R}$ also contributes to correction of curvature of field.

Further, the above-described intermediate lens group $G_{2M}$ comprises a first intermediate lens $L_{M1}$ with a positive refracting power placed between the front lens $L_{2F}$ and the rear lens $L_{2R}$, a second intermediate lens $L_{M2}$ with a negative refracting power placed between the first intermediate lens $L_{M1}$ and the rear lens $L_{2R}$, and a third intermediate lens $L_{M3}$ with a negative refracting power placed between the second intermediate lens $L_{M2}$ and the rear lens $L_{2R}$. In the intermediate lens group $G_{2M}$, the first intermediate lens $L_{M1}$ having a positive refracting power partakes in correction of negative distortion generated by the second and third intermediate lenses $L_{M2}$ and $L_{M3}$ which greatly contribute to correction of curvature of field.

Preferably, when the focal length of the first lens group $G_5$ is $f_1$, the focal length of the second lens group $G_2$ is $f_2$, the focal length of the third lens group $G_3$ is $f_3$, the focal length of the fourth lens group $G_4$ is $f_4$, the focal length of the fifth lens group $G_5$ is $f_5$, the focal length of the sixth lens group $G_6$ is $f_6$, the distance from the first object R to the second object W is L, the radius of curvature of the surface of the front lens $L_{2F}$ on the first object side is $r_{2Ff}$, the radius of curvature of the surface of the front lens $L_{2F}$ on the second object side is $r_{2Fr}$, the radius of curvature of the surface of the rear lens $L_{2R}$ on the first object side is $r_{2Rf}$, and the radius of curvature of the surface of the rear lens $L_{2R}$ on the second object side is $r_{2Rr}$, the projection optical system of the present invention satisfies the following conditions (1) to (8):

(1) $f_1/L < 0.8$ (2) $-0.10 < f_2/L$ (3) $0.01 < f_3/L < 1.0$ (4) $f_4/L < -0.005$ (5) $0.01 < f_5/L < 0.9$ (6) $0.02 < f_6/L < 1.6$ (7) $1.00 < (r_{2Ff} - r_{2Fr})/(r_{2Ff} + r_{2Fr}) < 5.0$ (8) $-10.0 < (r_{2Rf} - r_{2Rr})/(r_{2Rf} + r_{2Rr}) \leq -1.00$.

The condition (1) defines an optimal ratio of the focal length $f_1$ of the first lens group $G_1$ having a positive refracting power to the distance (object-to-image distance) L from the first object R (reticle or the like) to the second object W (wafer or the like). This is a condition for mainly correcting distortion in a well-balanced manner.

Above the upper limit of the ratio defined by the condition (1), negative distortion is generated too much. Preferably, in order to attain a compact size while securing a reducing magnification and a broad exposure area and to further effectively correct distortion, the upper limit of the ratio in the condition (1) is set to 0.14 so as to define a condition of $f_1/L < 0.14$. Here, in order to suppress generation of spherical aberration at pupils, the lower limit of the ratio in the condition (1) is set to 0.02 so as to define a condition of $0.02 < f_1/L$.

The condition (2) defines an optimal ratio of the focal length $f_2$ of the second lens group $G_2$ having a negative refracting power to the distance (object-to-image distance) L from the first object R (reticle or the like) to the second object W (wafer or the like). This is a condition for attaining a compact size while securing a broad exposure area and effectively correcting Petzval sum.

Here, below the lower limit of the ratio defined by the condition (2), it becomes difficult to attain a compact size while securing a broad exposure area. Also, under this circumstance, positive Petzval sum may be unfortunately generated. Preferably, in order to attain a further compact size or in order to further effectively correct Petzval sum, the lower limit of the ratio in the condition (2) is set to −0.032 so as to define a condition of $-0.032 < f_2/L$. On the other hand, preferably, in order to suppress generation of negative distortion, the upper limit of the ratio in the condition (2) is set to −0.005 so as to define a condition of $f_2/L < -0.005$.

The condition (3) defines an optimal ratio of the focal length $f_3$ of the third lens group $G_3$ having a positive refracting power to the distance (object-to-image distance) L from the first object R (reticle or the like) to the second object W (wafer or the like). Here, below the lower limit of the ratio defined by the condition (3), the refractive power of the second lens group $G_2$ or fourth lens group $G_4$ becomes too strong. As a result, negative distortion and coma may occur in the second lens group $G_2$, while coma may occur in the fourth lens group $G_4$. Above the upper limit of the ratio defined by the condition (3), on the other hand, the refractive power of the second lens group $G_2$ or fourth lens group $G_4$ becomes so weak that Petzval sum may not be effectively corrected.

The condition (4) defines an optimal ratio of the focal length $f_4$ of the fourth lens group $G_4$ having a negative refracting power to the distance (object-to-image distance) L from the first object R (reticle or the like) to the second object W (wafer or the like).

Here, above the upper limit of the ratio defined by the condition (4), coma may be generated unfortunately. Preferably, in order to further suppress the generation of coma, the upper limit of the ratio in the condition (4) is set to −0.047 so as to define a condition of $f_4/L < -0.047$. Here, preferably, in order to effectively correct spherical aberration, the lower limit of the ratio in the condition (4) is set to −0.098 so as to define a condition of $-0.098 < f_4/L$.

The condition (5) defines an optimal ratio of the focal length $f_5$ of the fifth lens group $G_5$ having a positive refracting power to the distance (object-to-image distance) L from the first object R (reticle or the like) to the second object W (wafer or the like). This is a condition for correcting spherical aberration, distortion, and Petzval sum in a well-balanced manner while maintaining a large numerical aperture. Below the lower limit of the ratio defined by the condition (5), the refractive power of the fifth lens group $G_5$ becomes too strong. As a result, not only negative distortion but an enormous amount of negative spherical aberration may be generated in the fifth lens group $G_5$. Above the upper limit of the ratio defined by the condition (5), the refractive power of the fifth lens group $G_5$ becomes so weak that the refractive power of the fourth lens group $G_4$ inevitably decreases. As a result, Petzval sum may not be corrected effectively.

The condition (6) defines an optimal ratio of the focal length $f_6$ of the sixth lens group $G_6$ having a positive refracting power to the distance (object-to-image distance) L from the first object R (reticle or the like) to the second object w (wafer or the like). This is a condition for suppressing generation of high-order spherical aberration and negative distortion, while maintaining a large numerical aperture. Below the lower limit of the ratio defined by the condition (6), the sixth lens group $G_6$ itself may generate a large amount of negative distortion. Above the upper limit of the ratio defined by the condition (6), on the other hand, high-order spherical aberration may occur.

The condition (7) defines a so-called shape factor to obtain an appropriate shape of the front lens $L_{2F}$ in the second lens group $G_2$ when the radius of curvature of the surface of the front lens $L_{2F}$ on the first object side is $R_{2Ff}$ and the radius of curvature of the surface of the front lens $L_{2F}$ on the second object side is $r_{2Fr}$. Below the lower limit of the ratio defined by the condition (7), it is undesirable in that spherical aberration at pupils may not be sufficiently corrected. Above the upper limit of the ratio defined by the condition (7), on the other hand, coma may be unfortunately generated.

The condition (8) defines a so-called shape factor to obtain an appropriate shape of the rear lens $L_{2R}$ in the second lens group $G_5$ when the radius of curvature of the surface of the rear lens $L_{2R}$ on the first object side is $r_{2Rf}$ and the radius of curvature of the surface of the rear lens $L_{2R}$ on the second object side is $r_{2Rr}$. Below the lower limit or above the upper limit of the ratio defined by the condition (8), high-order spherical aberration and high-order coma may unfortunately occur while curvature of field is generated.

Preferably, in order to correct high-order spherical aberration and high-order coma in a well-balanced manner, the lower limit of the ratio in the condition (8) is set to −5.0 so as to define a condition of $-5.0<(r_{2Rf}-r_{2Rr})/(r_{2Rf}+r_{2Rr})$. Also, in order to correct curvature of field in a well-balanced manner while further effectively correcting high-order spherical aberration and high-order coma, the lower limit of the ratio in the condition (8) is preferably set to −2.0 so as to define a condition of $-2.0<(r_{2Rf}-r_{2Rr})/(r_{2Rf}+r_{2Rr})$.

Further, when the axial distance from the first object R to the first-object-side focal point of the entire projection optical system is I and the distance from the first object R to the second object W is L, the projection optical system preferably satisfies the following condition (9):

(9) $1.0<I/L$.

The condition (9) defines an optimal ratio of the axial distance I from the first object R to the first-object-side focal point of the entire projection optical system to the distance (object-to-image distance) L from the first object R (reticle or the like) to the second object w (wafer or the like). Here, "first-object-side focal point of the entire projection optical system" refers to an intersecting point of emergent light with an optical axis of the projection optical system when parallel light in the paraxial region with respect to the optical axis of the projection optical system is made incident from the second object side of the projection optical system and the light in the paraxial region is emergent from the projection optical system.

Below the lower limit of the ratio defined by the condition (9), telecentricity of the projection optical system on the first object side is lost so much that fluctuation in magnification due to deviation of the first object R in the optical axis direction and fluctuation in distortion may become large. As a result, it becomes difficult to faithfully project an image of the first object R onto the second object w under a desired magnification. Preferably, in order to more sufficiently suppress the fluctuation in magnification due to deviation of the first object R in the optical axis direction and fluctuation in distortion, the lower limit of the ratio in the condition (9) is set to 1.7 so as to define a condition of $1.7<I/L$. Further, in order to correct both spherical aberration at pupils and distortion in a well-balanced manner while maintaining a compact size of the projection optical system, the upper limit of the ratio in the condition (9) is preferably set to 6.8 so as to define a condition of $I/L<6.8$.

Also, the above-mentioned fifth lens group $G_5$ includes at least seven positive lenses. Preferably, in this case, the fifth lens group $G_5$ further includes at least one negative lens.

Namely, when the fifth lens group $G_5$ has at least seven positive lenses, the refractive power carried by the fifth lens group $G_5$ itself can be distributed to the separate positive lenses in a well-balanced manner. Accordingly, negative spherical aberration which is likely to occur in the fifth lens group $G_5$ as its numerical aperture (N.A.) increases can be effectively suppressed. Further, when the fifth lens group $G_5$ has at least seven positive lenses, high resolution of the projection optical system is secured.

In this case, in order to sufficiently attain functions to correct negative distortion and Petzval sum, the fifth lens group $G_5$ preferably has at least one negative lens in addition to at least seven positive lenses.

Preferably, when the focal length of the second intermediate lens $L_{M2}$ is $f_{22}$ and the focal length of the third intermediate lens $L_{M3}$ is $f_{23}$, the projection optical system satisfies the following condition (10):

(10) $0.1<f_{22}/f_{23}<10$.

Below the lower limit of the ratio defined by the condition (10), the refractive power of the second intermediate lens $L_{M2}$ becomes stronger than that of the third intermediate lens $L_{M3}$. As a result, a large amount of coma and negative distortion is generated in the second intermediate lens $L_{M2}$. Preferably, in order to further correct negative distortion in a well-balanced manner, the lower limit of the ratio in the condition (10) is set to 0.7 so as to define a condition of $0.7<f_{22}/f_{23}$. Above the upper limit of the ratio defined by the condition (10), the refractive power of the third intermediate lens $L_{M3}$ becomes stronger than that of the second intermediate lens $L_{M2}$. Accordingly, a large amount of coma and negative distortion is generated in the third intermediate lens $L_{M3}$. In order to further correct negative distortion in a well-balanced manner while effectively correcting coma, the upper limit of the ratio in the condition (10) is preferably set to 1.5 so as to define a condition of $f_{22}/f_{23}<1.5$.

Also, the above-mentioned fifth lens group $G_5$ has a negative lens $L_{59}$ located as closest to the second object W and shaped with a concave surface to the second object W. Accordingly, the negative lens $L_{59}$ located as closest to the second object W in the fifth lens group $G_5$ can generate positive distortion and negative Petzval sum. This means that the negative distortion and positive Petzval sum generated by the positive lenses in the fifth lens group $G_5$ can be offset thereby.

In this case, in order to suppress negative distortion without generating high-order spherical aberration, a lens $L_{61}$, positioned as closest to the first object R in the sixth lens group $G_6$ preferably has such a shape that its lens surface on the first object side is a convex surface facing the first object R. In particular, when the radius of curvature of the above-mentioned negative lens $L_{59}$ in the fifth lens group $G_5$ on the second object side is $r_{5R}$ and the radius of curvature of the above-mentioned lens $L_{61}$ in the sixth lens group $G_6$ on the first object side is $r_{6F}$, the projection optical system preferably satisfies the following condition (11):

(11) $-0.90 < (r_{5R} - r_{6F})/(r_{5R} + r_{6F}) < -0.001$.

The condition (11) defines an optimal form of a gas lens formed between the fifth lens group $G_5$ and the sixth lens $G_6$. Below the lower limit of the ratio defined by the condition (11), the curvature of the concave surface on the second object side of the negative lens $L_{59}$ positioned as closest to the second object W in the fifth lens group $G_5$ becomes too strong. Under this circumstance, high-order coma may occur. Above the upper limit of the ratio defined by the condition (11), the inherent refractive power of the gas lens formed between the fifth lens group $G_5$ and the sixth lens $G_6$ becomes too weak. As a result, the amount of positive distortion generated in this gas lens becomes so small that it becomes difficult to effectively correct negative distortion generated in the positive lenses in the fifth lens group $G_5$. Here, in order to more sufficiently suppress generation of high-order coma, the lower limit of the ratio in the condition (11) is preferably set to $-0.30$ so as to define a condition of $-0.30 < (r_{5R} - r_{6F})/(r_{5R} + r_{6F})$.

Also, when the lens group distance between the fifth lens group $G_5$ and the sixth lens group $G_6$ is $d_{56}$ and the distance from the first object R to the second object W is L, the projection optical system preferably satisfies the following condition (12):

(12) $d_{56}/L < 0.017$.

Above the upper limit of the ratio defined by the condition (12), the lens group distance between the fifth lens group $G_5$ and the sixth lens group $G_6$ becomes so large that the amount of positive distortion generated thereby may be too small. As a result, it becomes difficult to correct, in a well-balanced manner, negative distortion generated in the positive lenses in the fifth lens group $G_5$.

Also, when the radius of curvature of the lens surface included in the sixth lens group $G_6$ and positioned as closest to the first object R is $r_{6F}$ and the axial distance from this lens surface of the sixth lens group $G_6$ to the second object w is $d_6$, the projection optical system preferably satisfies the following condition (13):

(13) $0.50 < d_6/r_{6F} < 1.50$.

Below the lower limit of the ratio defined by the condition (13), the positive refracting power of the lens surface positioned as closest to the first object R in the sixth lens group $G_6$ becomes too strong. Consequently, a large amount of negative distortion and coma may occur. Above the upper limit of the ratio defined by the condition (13), the positive refracting power of the lens surface positioned as closest to the first object R in the sixth lens group $G_6$ becomes too weak. As a result, a large amount of coma may occur. Desirably, in order to further suppress the generation of coma, the lower limit of the ratio in the condition (13) is set to 0.84 so as to define a condition of $0.84 < d_6/r_{6F}$.

As mentioned above, the above-mentioned fifth lens group $G_5$ has the negative lens $L_{59}$ located as closest to the second object W and shaped with a concave surface to the second object W. Preferably, in this case, when the radius of curvature of the negative lens $L_{59}$ in the fifth lens group $G_5$ on the first object side is $r_{5F}$ and the radius of curvature of the negative lens $L_{59}$ in the fifth lens group $G_5$ on the second object side is $r_{5R}$, the projection optical system further satisfies the following condition (14):

(14) $0.30 < (r_{5F} - r_{5R})/(r_{5F} + r_{5R}) < 1.28$.

Below the lower limit of the ratio defined by the condition (14), it becomes difficult to correct both Petzval sum and coma at the same time. Above the upper limit of the ratio defined by the condition (14), on the other hand, a large amount of high-order coma may unfavorably occur. Preferably, in order to prevent higher-order coma from occurring, the upper limit of the ratio in the condition (14) is set to 0.93 so as to define a condition of $(r_{5F} - r_{5R})/(r_{5F} + r_{5R}) < 0.93$.

Also, when the focal length of the first intermediate lens $L_{M1}$ in the intermediate lens group $G_{2M}$ is $f_{21}$ and the distance from the first object R to the second object W is L, the projection optical system preferably satisfies the following condition (15):

(15) $0.230 < f_{21}/L < 0.40$.

Below the lower limit of the ratio defined by the condition (15), positive distortion may occur. Above the upper limit of the ratio defined by the condition (14), on the other hand, negative distortion may unfavorably occur. Desirably, in order to further correct negative distortion, the lens surface of the first intermediate lens $L_{M1}$ on the second object side has such a lens shape that a convex surface thereof faces the second object w.

Also, when the focal length of the front lens $L_{2F}$ in the second lens group $G_2$ is $f_{2F}$ and the focal length of the rear lens $L_{2R}$ in the second lens group $G_2$ is $f_{2R}$, the projection optical system preferably satisfies the following condition (16):

(16) $0 < f_{2F}/f_{2R} < 18$.

The condition (16) defines an optimal ratio of the focal length $f_{2F}$ of the front lens $L_{2F}$ in the second lens group $G_2$ to the focal length $f_{2R}$ of the rear lens $L_{2R}$ in the second lens group $G_2$. Below the lower limit or above the upper limit of the ratio defined by the condition (16), the refractive power of the first lens group $G_1$ or third lens group $G_3$ may lose its balance. As a result, it becomes difficult to effectively correct distortion or effectively correct both Petzval sum and astigmatism at the same time.

Here, in order to further effectively correct Petzval sum, the intermediate lens group $G_{2M}$ in the second lens group $G_2$ preferably has a negative refracting power.

Also, desirably, in order to attain sufficient functions for correcting aberration, the above-mentioned respective lens groups specifically have the following configurations.

Namely, in order to suppress generation of high-order distortion and pupil spherical aberration, the first lens group $G_1$ has at least two positive lenses. In order to prevent spherical aberration and Petzval sum from deteriorating, the third lens group $G_3$ has at least three positive lenses. In order to suppress generation of coma while correcting Petzval sum, the fourth lens group $G_4$ has at least three negative lenses. Further, in order to converge light onto the second object W without generating a large amount of spherical aberration, the sixth lens group $G_6$ has at least one positive lens.

Also, in order to attain a compact size, the number of the negative lenses constituting the intermediate lens group $G_{2M}$ in the second lens group $G_2$ is desirably limited to two.

In order to further suppress generation of negative distortion, the above-mentioned sixth lens group $G_6$ is preferably constituted by not more than three lenses each having a lens surface which satisfies at least the following condition (17):

(17) $1/|\Phi L| < 20$.

where $\Phi$: the refractive power of each lens surface, and

L: the object-to-image distance from the first object R to the second object W.

Here, the refractive power of a lens surface is given by the following equation:

$$\Phi = (n_2 - n_1)/r$$

where r: the radius of curvature of the lens surface, n$_1$ the refractive index of the medium on the first object side of the lens surface, and n$_2$: the refractive index of the medium on the second object side of the lens surface.

Here, when there are four or more lenses each having at least a lens surface satisfying condition (17), the number of the lens surfaces having a certain degree of curvature disposed near the second object W unfavorably increases, thereby causing distortion to occur.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 7 to 10 are aberration diagrams showing various kinds of aberration in the first embodiment shown in FIG. 4, wherein FIGS. 7, 8, 9, and 10 respectively show spherical aberration, astigmatism, distortion (%), and coma in the first embodiment;

FIGS. 11 to 14 are aberration diagrams showing various kinds of aberration in the second embodiment shown in FIG. 5, wherein FIGS. 11, 12, 13, and 14 respectively show spherical aberration, astigmatism, distortion (%), and coma in the second embodiment;

FIGS. 15 to 18 are aberration diagrams showing various kinds of aberration in the third embodiment shown in FIG. 6, wherein FIGS. 15, 16, 17, and 18 respectively show spherical aberration, astigmatism, distortion (%), and coma in the third embodiment.

DETAILED DESCRIPTION OF THE PREFERRED EMBODIMENTS

Figure 1:
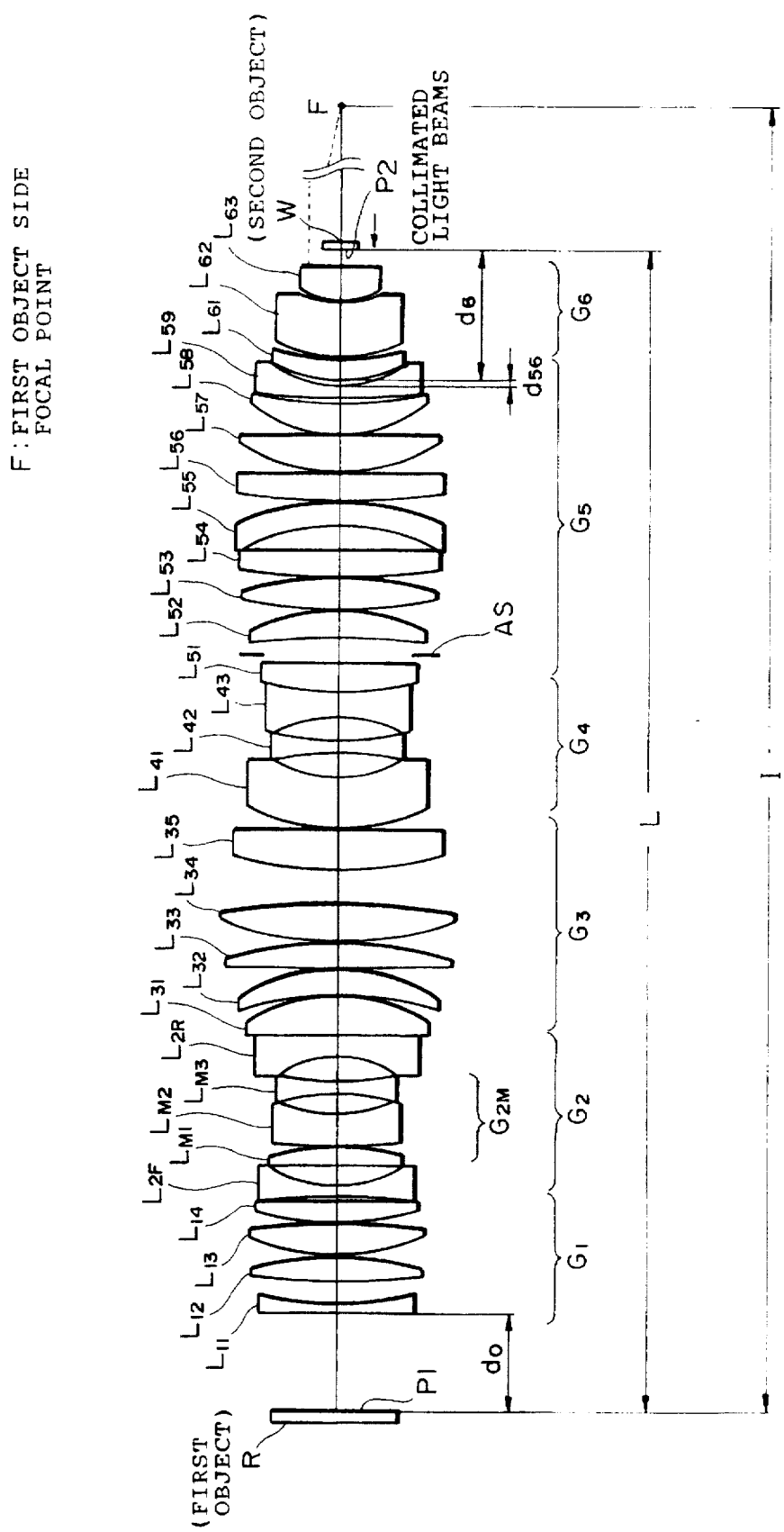
FIG. 1 is a view for explaining each section which is common to lens configurations of the projection optical system according to the present invention.

The projection optical system according to the present invention will be explained referring to FIG. 2 to FIG. 19. FIG. 1 will be made reference to when necessary.

Figure 2:
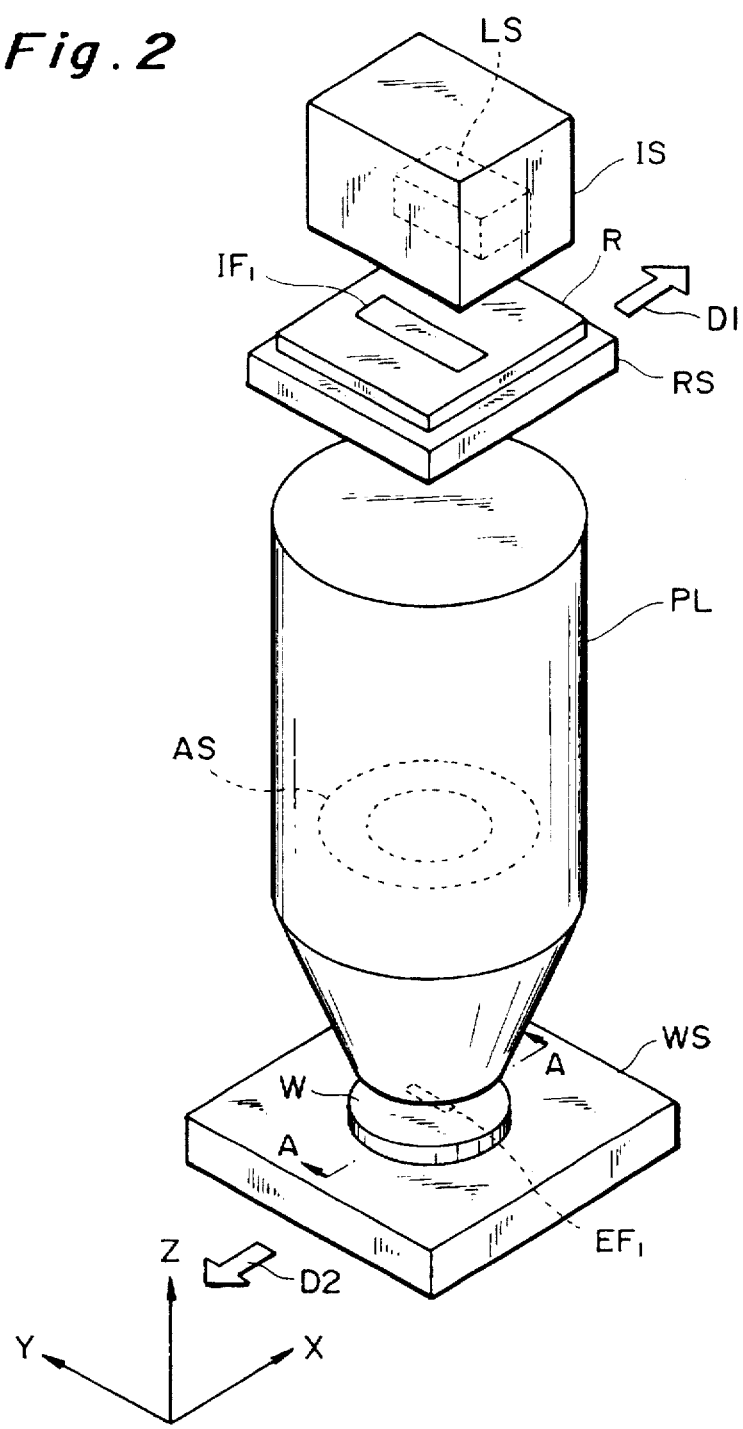
FIG. 2 is a view showing a schematic configuration of a scanning type exposure apparatus to which the projection optical system according to the present invention is applicable.

FIG. 2 is a drawing to show the schematic setup of a scanning exposure apparatus to which the projection optical system according to the present invention can be applied.

FIG. 2 will be explained briefly. In the exposure apparatus shown in FIG. 2, the reticle R (first object) as a photomask on which predetermined circuit patterns are formed is disposed on the object plane P1 of the projection optical system PL, and the wafer W (second object) as a photosensitive substrate is disposed on the image plane P2 of the projection optical system PL. The reticle R is held on a reticle stage RS arranged to move in the X-direction (corresponding to the arrow D1 in FIG. 2) upon exposure, and the wafer W is held on a wafer stage WS arranged to move in the X-direction (corresponding to the arrow D2 in FIG. 2) opposite to movement of the reticle stage RS. As shown in FIG. 2, a slit (rectangular) illumination area $I_{F_1}$ extending in the Y-direction is formed on the reticle R, and an illumination optical system IS for uniformly illuminating the illumination area $IF_1$ is disposed above the reticle R. Exposure light is emitted from a light source LS provided in the illumination system.

In the above arrangement, the light supplied from the light source LS in the illumination optical system IS illuminates the reticle R in a slit pattern. An image of the light source LS in the illumination optical system IS is formed at the position of the pupil (the position of aperture stop AS) of the projection optical system PL, thus realizing so-called Köhler illumination. Then an image of the pattern of reticle R Köhler-illuminated is projected (or transferred) onto the wafer W through the projection optical system PL.

Figure 3:
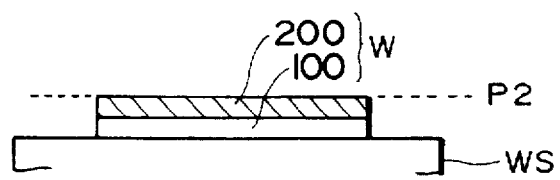
FIG. 3 is a view showing a cross-sectional configuration of a photosensitive substrate along line A—A of FIG. 2.

The photosensitive substrate placed on the above wafer stage WS is one obtained by coating the entire surface of exposed object 100 such as a silicon wafer, a glass plate, or the like with a photosensitive material 200 such as a photoresist, as shown in FIG. 3.

On this occasion, an area $EF_1$ of the pattern image of reticle R exposed on the wafer W is a slit pattern (rectangular shape) extending in the Y-direction, as shown in FIG. 2. Thus, when the projection magnification factor of the projection optical system PL is 1/M, the reticle stage RS and wafer stage WS are moved in mutually opposite directions (corresponding to the arrows D1 and D2, respectively) along the X-direction in the velocity ratio of M:1, thereby the pattern image of the entire surface of reticle R is transferred onto the wafer W.

The art related to various exposure apparatus as described above is disclosed, for example, in U.S. patent applications No. 08/255,927, No. 08/260,398, and No. 08/299,305, and U.S. Pat. Nos. 4,497,015, No. 4,666,273, No. 5,194,893, No. 5,253,110, No. 5,333,035, and No. 5,379,091. The projection optical system according to the present invention can be applied to any exposure apparatus disclosed in the listed references.

The above U.S. patent application Ser. No. 08/255,927 describes the illumination optical system (using a laser light source) applicable to the scanning exposure apparatus. The above U.S. patent application No. 08/260,398 describes the illumination optical system (using a lamp light source) applicable to the scanning exposure apparatus. The U.S. patent application No. 08/299,305 discloses an alignment mechanism applicable to the scanning exposure apparatus. The U.S. Pat. No. 4,497,015 describes the illumination optical system (using a lamp light source) applicable to popular exposure apparatus. The U.S. Pat. No. 4,666,273 discloses an example of the step-and-repeat type exposure apparatus. The U.S. Pat. No. 5,194,893 discloses the scanning exposure apparatus, particularly, the illumination optical system, illumination area, maskside and reticle-side interference systems, automatic focusing mechanism, and alignment optical system. The U.S. Pat. No. 5,253,110 describes the illumination optical system (using a laser light source) applicable to the step-and-repeat type exposure apparatus. However, the illumination optical system disclosed in this reference can also be applied to the scanning exposure apparatus. The U.S. Pat. No. 5,333,035 discloses a modified illumination optical system applicable to popular exposure apparatus. The U.S. Pat. No. 5,379,091 discloses the illumination optical system (using a laser light source) applicable to the scanning exposure apparatus. In addition, U.S. Pat. No. 5,245,384 also shows the illumination optical system using a mercury lamp, applicable to ordinary exposure apparatus (steppers).

Figure 4:
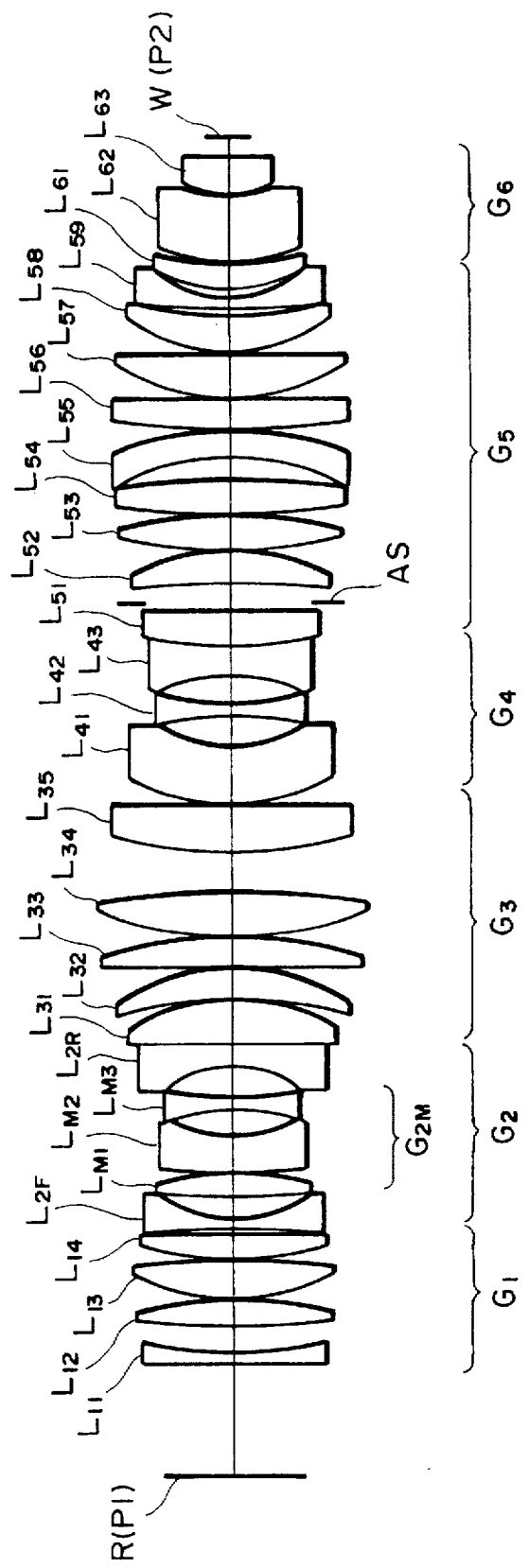
FIG. 4 is a view showing a lens arrangement of the first embodiment of the projection optical system according to the present invention.
Figure 5:
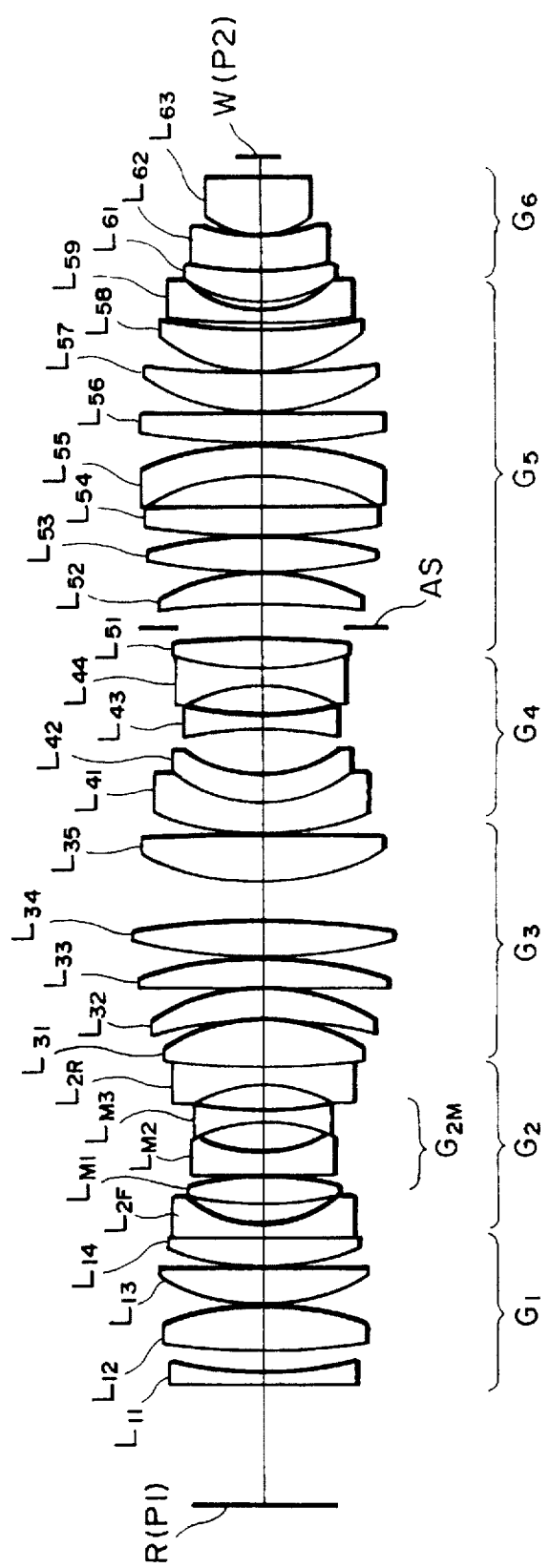
FIG. 5 is a view showing a lens arrangement of the second embodiment of the projection optical system according to the present invention.
Figure 6:
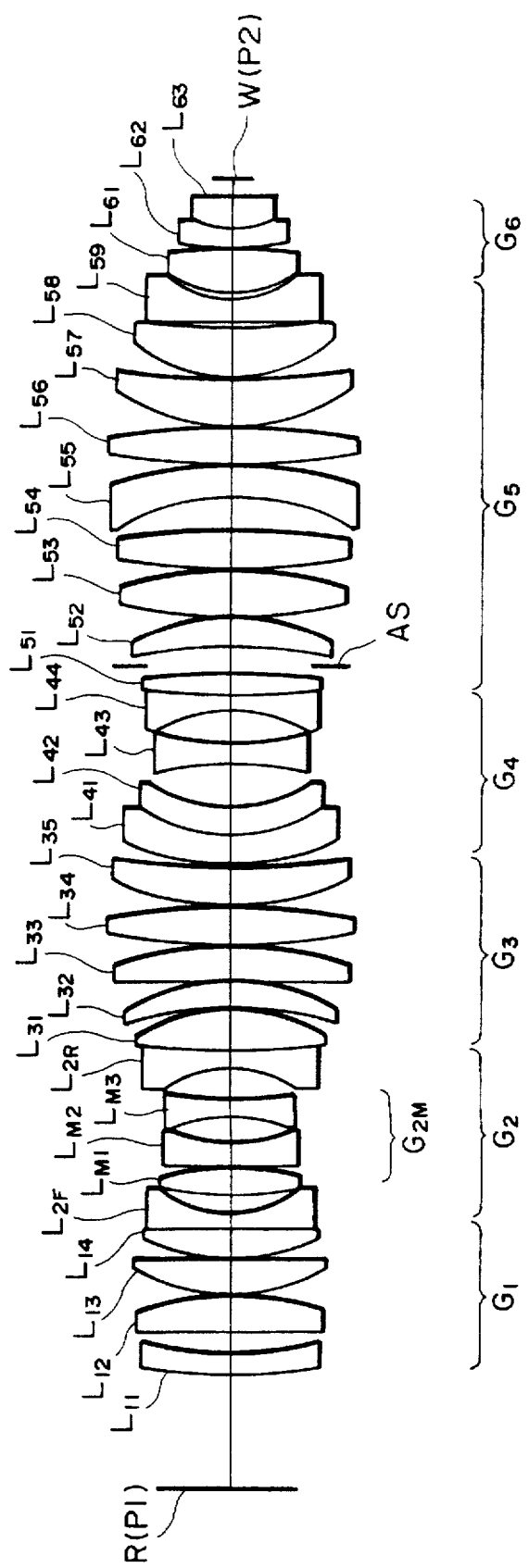
FIG. 6 is a view showing a lens arrangement of the third embodiment of the projection optical system according to the present invention.

Now, the following embodiments show examples of the projection optical system to which a high pressure mercury lamp for supplying light having the exposure wavelength $\lambda$ of i-line (365 nm) is applicable as a light source LS disposed inside the illumination optical system IS. FIG. 4 to FIG. 6 show lens layouts of the first to third embodiments of the projection optical system according to the present invention.

As shown in FIG. 4 to FIG. 6, the projection optical system in each lens layout is composed of, in order from the side of reticle R as a first object, the first lens group $G_5$ having a positive refracting power, the second lens group $G_2$ having a negative refracting power, the third lens group $G_3$ having a positive refracting power, the fourth lens group $G_4$ having a negative refracting power, the fifth lens group $G_5$ having a positive refracting power, and the sixth lens group $G_6$ having the positive refracting power. These examples of the projection optical system are approximately telecentric on the object side (on the reticle side) and on the image side (on the wafer side) thereof, and have demagnification factors.

In each of the projection optical systems shown in FIGS. 4 to 6, object-to-image distance L (distance from an object surface P1 to an image surface P2 or the distance from the reticle R to the wafer W) is 1,000, image-side numerical aperture NA is 0.6, projection magnification B is 1/4, and diameter of the exposure area on the wafer w or diagonal length of the slit-like exposure area on the wafer W of the projection optical system PL is 26.7.

In the following, a specific lens arrangement of the first embodiment will be explained with reference to FIG. 4. First, the first lens group $G_5$ has, in order from the reticle R toward the wafer W, a negative meniscus lens $L_{11}$ whose concave surface faces the image surface P2, a positive lens (positive lens having a biconvex shape) $L_{12}$ whose stronger convex surface faces the image surface P2, and two positive lenses (positive lenses each having a biconvex shape) $L_{13}$ and $L_{14}$ whose respective stronger convex surfaces face the object surface P1.

The second lens group $G_2$ has a negative lens (biconcave negative lens: front lens) $L_2$ which is disposed as closest to the object R (reticle) and whose stronger concave surface faces the image surface P2, a negative lens (plano-concave negative lens: rear lens) $L_{2R}$ which is disposed as closest to the image w (wafer) and whose concave surface faces the object surface P1, and an intermediate lens group $G_{2M}$ which is disposed between these negative lenses $L_{2F}$ and $L_{2R}$ and has a negative refracting power. The intermediate lens group $G_{2M}$ has, in order from the reticle R toward the wafer W, a positive lens (positive biconvex lens: first lens) $L_{M1}$ whose stronger convex surface faces the image surface P2, a negative lens (negative meniscus lens: second lens) $L_{M2}$ whose concave surface faces the image surface P2, and a negative lens (negative biconcave lens: third lens) $L_{M3}$ whose stronger concave surface faces the object surface P1.

The third lens group $G_3$ has, in order from the reticle R toward the wafer W, two positive lenses (positive meniscus lenses) $L_{31}$ and $L_{32}$ whose respective convex surfaces face the image surface P2, a positive lens (positive biconvex lens) $L_{33}$ whose stronger convex surface similarly faces the image surface P2, and a positive lens (positive biconvex lens) $L_{34}$ whose stronger convex surface faces the object surface P1, and a positive lens (positive meniscus lens) $L_3$, whose convex surface similarly faces the object surface P1.

The fourth lens group $G_4$ has, in order from the reticle R toward the wafer W, a negative lens (negative meniscus lens) $L_{41}$ whose concave surface faces the image surface P2, a negative biconcave lens $L_{42}$, and a negative lens (negative biconcave lens) $L_{43}$ whose stronger concave surface faces the object surface P1.

The fifth lens group $G_5$ has, in order from the reticle R toward the wafer W, a positive lens (positive biconvex lens) $L_{51}$ whose stronger convex surface faces the object surface P1, a positive lens (positive meniscus lens) $L_{52}$ whose convex surface faces the image surface P2, two positive lenses (positive biconvex lenses) $L_{53}$ and $L_{54}$ whose respective stronger convex surfaces similarly face the image surface P2, a negative lens (negative meniscus lens) $L_{55}$ whose concave surface faces the object surface P1, three positive lenses (positive meniscus lenses) $L_{56}$, $L_{57}$, and $L_{58}$ whose respective convex surfaces face the object surface P1, and a negative lens (negative meniscus lens) $L_{59}$ whose concave surface faces the image surface P2.

Finally, the sixth lens group $G_6$ has, in order from the reticle R toward the wafer W, a positive lens (positive biconvex lens) $L_{61}$ whose stronger convex surface faces the object surface P1, a negative lens (negative meniscus lens) $L_{62}$ whose concave surface faces the image surface P2, and a positive lens (positive meniscus lens) $L_6$ whose convex surface faces the object surface P1.

Here, in the first lens group $G_1$ in the first embodiment, since the image-side lens surface of the negative lens (negative meniscus lens) $L_{11}$, whose concave surface faces the image surface P2, and the object-side lens surface of the positive biconvex lens $L_{12}$ have similar degrees of curvature and are relatively close to each other, these two lens surfaces correct high-order distortion.

In the intermediate lens group $G_{2M}$ in the first embodiment, the first lens $L_{M1}$ has a biconvex shape having not only a convex surface facing the image surface P2 but also a convex surface facing the object surface P1. Accordingly, generation of spherical aberration at pupils can be suppressed.

In the fourth lens group $G_4$ in the first embodiment, the negative meniscus lens $L_{41}$, whose concave surface faces the image surface P2, is located at the object side of the negative lens (negative biconcave lens) $L_{42}$, while the negative lens $L_{43}$, whose stronger concave surface faces the object surface P1, is located at the image side of the negative lens $L_{42}$. Accordingly, Petzval sum can be corrected while generation of coma is suppressed.

Also, the positive lens $L_{54}$ in the fifth lens group $G_5$ has a convex surface facing the negative meniscus lens $L_{55}$, while the surface of the positive lens $L_{54}$ on the side opposite to the negative meniscus lens $L_{55}$ is also formed as a convex shape. Due to such a biconvex shape, the positive lens $L_{54}$ can suppress generation of high-order spherical aberration resulting from higher NA.

In the following, a lens arrangement of the second embodiment of the projection optical system according to the present invention will be explained with reference to FIG. 5. The second embodiment shown in FIG. 5 differs from the first embodiment shown in FIG. 4 in the lens arrangements of the first lens group $G_1$, second lens group $G_2$, third lens group $G_3$, and fourth lens group $G_4$.

In the first lens group $G_1$, while each of two positive lenses ($L_{13}$ and $L_{14}$) respectively disposed as the third and fourth lenses from the object (reticle) side is comprised of a positive biconvex lens in the first embodiment, each of these two positive lenses ($LI_3$ and $L_{14}$) is comprised of a positive meniscus lens whose convex surface faces the object surface P1 in the second embodiment.

In the intermediate lens group $G_{2M}$ in the second lens group $G_2$, while the negative lens $L_{M2}$ disposed as the second lens from the object side is composed of a negative meniscus lens in the first embodiment, it is composed of a biconcave lens in the second embodiment. Also, while the rear lens $L_{2R}$ in the second lens group $G_2$ is comprised of a negative plano-concave lens in the first embodiment, it is comprised of a biconcave lens in the second embodiment.

In the third lens group $G_3$, while each of the positive lenses ($L_{31}$ and $L_{35}$) respectively disposed as the first and fifth lenses from the object side is comprised of a positive meniscus lens in the first embodiment, each of these positive lenses ($L_{31}$ and $L_{35}$) is comprised of a biconvex lens in the second embodiment. Also, in the third lens group $G_3$, while the positive lens $L_{33}$ disposed as the third lens from the object side is comprised of a biconvex lens in the first embodiment, it is comprised of a positive meniscus lens in the second embodiment.

The fourth lens group $G_4$ in the second embodiment includes one additional negative lens as compared with the first embodiment, thereby comprising four negative lenses. Specifically, it comprises, in order from the reticle R toward the wafer W, two negative lenses (two negative meniscus lenses) $L_{41}$ and $L_{42}$ whose respective concave surfaces face the image surface P2, a negative biconcave lens $L_{43}$, and a negative lens (negative biconcave lens) $L_{44}$ whose stronger concave surface faces the object surface P1.

In the following, a lens arrangement of the third embodiment of the projection optical system according to the present invention will be explained with reference to FIG. 6.

The lens arrangement of the third embodiment shown in FIG. 6 differs from that of the first embodiment shown in FIG. 4 in the lens arrangement of each lens group.

In the first lens group $G_1$, while the positive lens $L_{14}$ disposed as the fourth lens from the object side (reticle side) is comprised of a positive biconvex lens in the first embodiment, it is comprised of a plano-convex lens whose convex surface faces the object surface P1 in the third embodiment.

In the second lens group $G_2$, while the rear lens $L_{2R}$ is comprised of a negative plano-concave lens in the first embodiment, it is comprised of a biconcave lens in the third embodiment.

In the third group $G_3$, while the positive lens $L_{31}$ disposed as the first lens from the object side is comprised of a positive meniscus lens in the first embodiment, it is comprised of a biconvex lens in the third embodiment. Also, in the third group $G_3$, while the positive lens $L_{33}$ disposed as the third lens from the object side is comprised of a biconvex lens in the first embodiment, it is comprised of a positive meniscus lens whose convex surface faces the image surface P2 in the third embodiment.

The fourth lens group $G_4$ in the third embodiment includes one additional negative lens as compared with the first embodiment, thereby comprising four negative lenses. Specifically, it comprises, successively from the reticle R toward the wafer W, two negative lenses (two negative meniscus lenses) $L_{41}$ and $L_{42}$ whose respective concave surfaces face the image surface P2, a negative biconcave lens $L_{43}$, and a negative lens (negative biconcave lens) $L_{44}$ whose stronger concave surface faces the object surface P1.

In the fifth lens group $G_5$, while the positive lens $L_{56}$ disposed as the sixth lens from the object side is comprised of a positive meniscus lens in the first embodiment, it is comprised of a biconvex lens in the third embodiment.

In the sixth lens group $G_6$, while the positive lens $L_{61}$ disposed as the first lens from the object side is comprised of a positive meniscus lens in the first embodiment, it is comprised of a biconvex lens in the third embodiment.

Here, in each of the above-mentioned embodiments, the aperture stop AS is disposed between the positive first lens $L_{51}$ and the positive second lens $L_{52}$ in the fifth lens group $G_5$.

While this aperture stop AS is disposed between two positive lenses ($L_{51}$ and $L_{52}$) which are positioned at the object side of the fifth lens group $G_5$ in these embodiments, without being restricted to such an arrangement, it may be disposed in any manner basically as long as it is disposed between the positive lens $L_{51}$, which is positioned as closest to the object R (reticle) in the fifth lens group $G_5$, and the image W (wafer). According to such an arrangement of the aperture stop AS, high-order spherical aberration which is likely to occur in the fifth lens group $G_5$ as NA increases can be suppressed.

The following Tables 1-1, 1-2, 2-1, 2-2, 3-1, and 3-2 show values of items and values corresponding to conditions in the lens arrangements of the first to third embodiments.

In these tables, the number at the left end indicates that counted from the object (reticle) side, r is the radius of curvature of the lens surface, d is the lens surface distance, n is the refractive index of the glass material at an exposure wavelength λ of 365 nm. $d_0$ is the distance from the first object (reticle R) to the lens surface (first lens surface) closest to the object R (reticle) in the first lens group $G_5$ along the optical axis, β is the projection magnification of the projection optical system. Bf is the distance from the lens surface closest to the second object (wafer W) in the sixth lens group $G_6$ to the image surface P2 along the optical axis, NA is the numerical aperture of the projection optical system on the image side (wafer side), and L is the object-to-image distance from the object surface P1 to the image surface P2. Also, in the tables, $f_1$ is the focal length of the first lens group $G_1$, $f_2$ is the focal length of the second lens group $G_2$, $f_3$ is the focal length of the third lens group $G_3$, $f_4$ is the focal length of the fourth lens group $G_4$, $f_5$ is the focal length of the fifth lens group $G_5$, $f_6$ is the focal length of the sixth lens group $G_6$, L is the distance (object-to-image distance) from the object surface P1 to the image surface P2, I is the axial distance from the first object (reticle R) to the first-objectside focal point of the projection optical system as a whole (wherein "first-object-side focal point of the entire projection optical system" means an intersecting point of emergent light with the optical axis of the projection optical system when parallel light (corresponding to the collimated light beams in FIG. 2) in the paraxial region with respect to the optical axis of the projection optical system is made incident from the second object side of the projection optical system and the light in the paraxial region is emergent from the projection optical system), $r_{2Ff}$ is the radius of curvature of the lens surface of the front lens $L_{2F}$ in the second lens group $G_2$ on the first object side, $R_{2Fr}$ is the radius of curvature of the lens surface of the front lens $L_{2F}$ in the second lens group $G_2$ on the second object side, $r_{2Rf}$ is the radius of curvature of the lens surface of the rear lens $L_{2R}$ in the second lens group $G_2$ on the first object side, $r_{2Rr}$ is the radius of curvature of the lens surface of the rear lens $L_{2R}$ in the second lens group $G_2$ on the second object side, $f_{22}$ is the focal length of the second intermediate lens $L_{M2}$ having a negative refracting power in the second lens group $G_2$, $f_{23}$ is the focal length of the third intermediate lens $L_{M3}$ having a negative refracting power in the second lens group $G_2$, $r_{5R}$ is the radius of curvature of the negative lens $L_{59}$ disposed closest to the second object in the fifth lens group $G_5$ on the second object side, $r_{6F}$ is the radius of curvature of the lens $L_{61}$ disposed as closest to the first object in the sixth lens group $G_6$ on the first object side, $d_{56}$ is the lens group distance between the fifth lens group $G_5$ and the sixth lens group $G_6$, $d_6$ is the axial distance from the lens surface closest to the first object in the sixth lens group $G_6$ to the second object, $r_{5F}$ is the radius of curvature of the negative lens $L_{59}$ disposed as closest to the second object in the fifth lens group $G_5$ on the first object side, $f_{21}$ is the focal length of the first intermediate lens $L_{M1}$ having a positive refracting power in the intermediate lens group $G_{M2}$ in the second lens group $G_2$, $f_{2F}$ is the focal length of the front lens $L_{2F}$ which has a negative refracting power and is disposed as closest to the first object in the second lens group $G_2$ with a concave surface thereof facing the second object, and $f_{2R}$ is the focal length of the rear lens $L_{2R}$ which has a negative refracting power and is disposed as closest to the second object in the second lens group $G_2$ with a concave surface thereof facing the first object.

TABLE 1-1

First Embodiment
d0 = 83.640
β = 1/4
NA = 0.6
Bf = 14.121
L = 1000

|  | r | d | n |
|---|---|---|---|
| 1 | 128677.136 | 8.182 | 1.61298 |
| 2 | 293.4978 | 19.777 | 1.00000 |
| 3 | 733.0945 | 19.908 | 1.61536 |
| 4 | −276.2965 | 0.902 | 1.00000 |
| 5 | 160.5226 | 27.774 | 1.61536 |
| 6 | −1121.887 | 0.903 | 1.00000 |
| 7 | 197.0142 | 19.561 | 1.61536 |
| 8 | −5123.833 | 3.680 | 1.00000 |
| 9 | −808.8663 | 8.321 | 1.61298 |
| 10 | 97.3205 | 17.113 | 1.00000 |
| 11 | 508.6693 | 17.637 | 1.48734 |
| 12 | −209.3140 | 0.728 | 1.00000 |
| 13 | 1018.142 | 26.122 | 1.61536 |
| 14 | 104.9497 | 21.817 | 1.00000 |
| 15 | −133.4481 | 8.182 | 1.61536 |
| 16 | 294.1678 | 23.755 | 1.00000 |

TABLE 1-1-continued

First Embodiment
d0 = 83.640
β = 1/4
NA = 0.6
Bf = 14.121
L = 1000

|  | r | d | n |
|---|---|---|---|
| 17 | −83.4305 | 16.320 | 1.61536 |
| 18 | ∞ | 1.504 | 1.00000 |
| 19 | −17955.912 | 33.996 | 1.48734 |
| 20 | −144.4431 | 0.454 | 1.00000 |
| 21 | −282.6077 | 22.793 | 1.61536 |
| 22 | −150.7697 | 0.448 | 1.00000 |
| 23 | 12827.403 | 22.385 | 1.61536 |
| 24 | −312.1358 | 0.436 | 1.00000 |
| 25 | 254.9928 | 31.655 | 1.61536 |
| 26 | −1227.045 | 31.029 | 1.00000 |
| 27 | 292.1926 | 35.591 | 1.61536 |
| 28 | 12400.116 | 1.598 | 1.00000 |
| 29 | 155.6453 | 41.806 | 1.61298 |
| 30 | 102.2932 | 24.043 | 1.00000 |
| 31 | −292.6880 | 8.182 | 1.61298 |
| 32 | 175.8594 | 23.488 | 1.00000 |
| 33 | −109.0332 | 20.202 | 1.61298 |
| 34 | 298.6580 | 0.896 | 1.00000 |
| 35 | 288.8583 | 26.185 | 1.48734 |
| 36 | −14594.326 | 20.767 | 1.00000 |
| 37 | −1255.597 | 24.418 | 1.48734 |
| 38 | −160.4655 | 0.445 | 1.00000 |
| 39 | 371.7490 | 26.930 | 1.48734 |
| 40 | −316.7563 | 0.447 | 1.00000 |
| 41 | 589.2451 | 22.727 | 1.61536 |
| 42 | −1496.002 | 19.748 | 1.00000 |
| 43 | −181.9479 | 19.374 | 1.61536 |
| 44 | −235.3947 | 0.444 | 1.00000 |
| 45 | 573.5610 | 22.727 | 1.61536 |
| 46 | 1738.076 | 0.446 | 1.00000 |
| 47 | 150.2531 | 32.718 | 1.48734 |
| 48 | 4993.174 | 0.437 | 1.00000 |
| 49 | 112.2373 | 27.348 | 1.48734 |
| 50 | 367.9341 | 5.301 | 1.00000 |
| 51 | 835.3150 | 8.182 | 1.61298 |
| 52 | 84.4017 | 4.924 | 1.00000 |
| 53 | 95.5273 | 19.397 | 1.48734 |
| 54 | 254.9529 | 0.879 | 1.00000 |
| 55 | 146.2194 | 46.552 | 1.61298 |
| 56 | 99.6039 | 0.885 | 1.00000 |
| 57 | 67.5095 | 29.770 | 1.48734 |
| 58 | 301.6801 | Bf | 1.00000 |

TABLE 1-2

Values corresponding to the Conditions in the First Embodiment (1) f1/L = 0.113
(2) f2/L = −0.0290
(3) f3/L = 0.0956
(4) f4/L = −0.0644
(5) f5/L = 0.0991
(6) f6/L = 0.142
(7) (r2Ff − r2Fr)/(r2Ff + r2Fr) = 1.27
(8) (r2Rf − r2Rr)/(r2Rf + r2Rr) = −1.00
(9) I/L = 3.21
(10) f22/f23 = 1.30
(11) (r5R − r6F)/(r5R + r6F) = −0.0618
(12) d56/L = 0.00492
(13) d6/r6F = 1.17
(14) (r5F − r5R)/(r5F + r5R) = 0.816
(15) f21/L = 0.307
(16) f2F/f2R = 1.04

TABLE 2-1

Second Embodiment
d0 = 90.225
β = 1/4
NA = 0.6
Bf = 14.121
L = 1000

|   | r | d | n |
|---|---|---|---|
| 1 | 6851.395 | 8.182 | 1.61298 |
| 2 | 246.2250 | 16.906 | 1.00000 |
| 3 | 517.5681 | 32.888 | 1.61536 |
| 4 | −232.9077 | 0.902 | 1.00000 |
| 5 | 146.8757 | 26.590 | 1.61536 |
| 6 | 1911.955 | 0.903 | 1.00000 |
| 7 | 169.5315 | 22.084 | 1.61536 |
| 8 | 25178.600 | 1.772 | 1.00000 |
| 9 | −7266.279 | 8.185 | 1.61298 |
| 10 | 84.3316 | 16.652 | 1.00000 |
| 11 | 244.9699 | 20.720 | 1.48734 |
| 12 | −205.5097 | 0.728 | 1.00000 |
| 13 | −1728.434 | 17.953 | 1.61536 |
| 14 | 98.4542 | 23.685 | 1.00000 |
| 15 | −111.0123 | 8.182 | 1.61536 |
| 16 | 341.7017 | 21.104 | 1.00000 |
| 17 | −90.7405 | 13.959 | 1.61536 |
| 18 | 1333.039 | 0.902 | 1.00000 |
| 19 | 1304.850 | 33.414 | 1.48734 |
| 20 | −141.7484 | 0.454 | 1.00000 |
| 21 | −264.7716 | 21.814 | 1.61536 |
| 22 | −157.3343 | 0.448 | 1.00000 |
| 23 | −7516.365 | 21.622 | 1.61536 |
| 24 | −286.8157 | 0.436 | 1.00000 |
| 25 | 366.7347 | 26.507 | 1.61536 |
| 26 | −706.3639 | 29.739 | 1.00000 |
| 27 | 199.2807 | 33.165 | 1.61536 |
| 28 | −12995.790 | 1.280 | 1.00000 |
| 29 | 201.9746 | 22.333 | 1.61536 |
| 30 | 113.1426 | 1.314 | 1.00000 |
| 31 | 110.8532 | 19.043 | 1.61298 |
| 32 | 101.5754 | 33.988 | 1.00000 |
| 33 | −218.6237 | 8.182 | 1.61536 |
| 34 | 221.9277 | 22.697 | 1.00000 |
| 35 | −124.6247 | 14.409 | 1.61298 |
| 36 | 300.1276 | 0.896 | 1.00000 |
| 37 | 297.2404 | 20.937 | 1.48734 |
| 38 | −466.9718 | 25.139 | 1.00000 |
| 39 | −485.0903 | 23.045 | 1.48734 |
| 40 | −163.4441 | 0.445 | 1.00000 |
| 41 | 383.8778 | 27.879 | 1.48734 |
| 42 | −305.7660 | 0.447 | 1.00000 |
| 43 | 718.0262 | 22.727 | 1.61536 |
| 44 | −1333.938 | 20.404 | 1.00000 |
| 45 | −181.4212 | 23.105 | 1.61298 |
| 46 | −229.5785 | 0.444 | 1.00000 |
| 47 | 427.7353 | 22.727 | 1.61536 |
| 48 | 3021.201 | 0.446 | 1.00000 |
| 49 | 146.0685 | 32.017 | 1.48734 |
| 50 | 1070.177 | 0.437 | 1.00000 |
| 51 | 112.8568 | 32.142 | 1.48734 |
| 52 | 370.6126 | 4.663 | 1.00000 |
| 53 | 716.6270 | 9.489 | 1.61298 |
| 54 | 80.6073 | 5.583 | 1.00000 |
| 55 | 94.1200 | 23.149 | 1.48734 |
| 56 | 444.3578 | 0.879 | 1.00000 |
| 57 | 246.5361 | 23.314 | 1.61298 |
| 58 | 116.9019 | 0.885 | 1.00000 |
| 59 | 72.8786 | 41.314 | 1.48734 |
| 60 | 312.3751 | Bf | 1.00000 |

TABLE 2-2

Values corresponding to the Conditions in the Second Embodiment (1) f1/L = 0.108
(2) f2/L = −0.0277
(3) f3/L = 0.0929
(4) f4/L = −0.0595
(5) f5/L = 0.0953
(6) f6/L = 0.150
(7) (r2Ff − r2Fr)/(r2Ff + r2Fr) = 1.02
(8) (r2Rf − r2Rr)/(r2Rf + r2Rr) = −1.15
(9) I/L = 3.22
(10) f22/f23 = 1.12
(11) (r5R − r6F)/(r5R + r6F) = −0.0773
(12) d56/L = 0.00558
(13) d6/r6F = 1.10
(14) (r5F − r5R)/(r5F + r5R) = 0.798
(15) f21/L = 0.233
(16) f2F/f2R = 0.988

TABLE 3-1

Third Embodiment
d0 = 87.583
β = 1/4
NA = 0.6
Bf = 14.121
L = 1000

|   | r | d | n |
|---|---|---|---|
| 1 | 610.0931 | 13.457 | 1.61298 |
| 2 | 276.5205 | 16.093 | 1.00000 |
| 3 | 1636.474 | 26.146 | 1.61536 |
| 4 | −268.0358 | 0.902 | 1.00000 |
| 5 | 147.5787 | 27.136 | 1.61536 |
| 6 | −2953.579 | 0.903 | 1.00000 |
| 7 | 172.7820 | 21.104 | 1.61536 |
| 8 | ∞ | 2.942 | 1.00000 |
| 9 | −1305.519 | 8.523 | 1.61298 |
| 10 | 83.4389 | 15.896 | 1.00000 |
| 11 | 275.7692 | 19.035 | 1.48734 |
| 12 | −219.5440 | 0.896 | 1.00000 |
| 13 | 3000.030 | 16.702 | 1.61536 |
| 14 | 96.8293 | 24.649 | 1.00000 |
| 15 | −118.7918 | 13.921 | 1.61536 |
| 16 | 387.2409 | 23.633 | 1.00000 |
| 17 | −86.3493 | 15.076 | 1.61536 |
| 18 | 1473.318 | 0.902 | 1.00000 |
| 19 | 1294.431 | 31.438 | 1.48734 |
| 20 | −131.0925 | 0.454 | 1.00000 |
| 21 | −287.8875 | 20.745 | 1.61536 |
| 22 | −165.2247 | 0.448 | 1.00000 |
| 23 | −1789.386 | 26.477 | 1.61536 |
| 24 | −284.3292 | 0.611 | 1.00000 |
| 25 | 409.7504 | 28.843 | 1.61536 |
| 26 | −643.5773 | 0.637 | 1.00000 |
| 27 | 180.9700 | 34.003 | 1.61536 |
| 28 | 1795.217 | 0.626 | 1.00000 |
| 29 | 206.8631 | 21.168 | 1.61536 |
| 30 | 123.5155 | 0.629 | 1.00000 |
| 31 | 121.0004 | 19.230 | 1.61298 |
| 32 | 104.2600 | 34.380 | 1.00000 |
| 33 | −268.7068 | 14.098 | 1.61298 |
| 34 | 196.7689 | 26.161 | 1.00000 |
| 35 | −114.8807 | 10.696 | 1.61298 |
| 36 | 797.4471 | 0.896 | 1.00000 |
| 37 | 575.0873 | 17.111 | 1.48734 |
| 38 | −474.8231 | 19.815 | 1.00000 |
| 39 | −400.0702 | 23.997 | 1.48734 |
| 40 | −154.7778 | 0.648 | 1.00000 |
| 41 | 491.6362 | 35.816 | 1.48734 |
| 42 | −280.5568 | 0.447 | 1.00000 |
| 43 | 631.9865 | 28.693 | 1.61536 |
| 44 | −880.8443 | 25.761 | 1.00000 |
| 45 | −182.5599 | 23.390 | 1.61298 |
| 46 | −302.7538 | 0.444 | 1.00000 |
| 47 | 619.3759 | 27.786 | 1.61536 |
| 48 | −529.1065 | 0.446 | 1.00000 |

TABLE 3-1-continued

Third Embodiment
d0 = 87.583
β = 1/4
NA = 0.6
Bf = 14.121
L = 1000

| | r | d | n |
|---|---|---|---|
| 49 | 155.8115 | 37.377 | 1.48734 |
| 50 | 980.3591 | 0.437 | 1.00000 |
| 51 | 113.0551 | 37.595 | 1.48734 |
| 52 | 503.2195 | 4.279 | 1.00000 |
| 53 | 1232.229 | 16.729 | 1.61298 |
| 54 | 76.4660 | 4.767 | 1.00000 |
| 55 | 87.1127 | 32.907 | 1.48734 |
| 56 | −1066.042 | 0.879 | 1.00000 |
| 57 | 520.6122 | 14.917 | 1.61298 |
| 58 | 84.7557 | 0.885 | 1.00000 |
| 59 | 62.7355 | 23.713 | 1.48734 |
| 60 | 269.7017 | Bf | 1.00000 |

TABLE 3-2

Values corresponding to the Conditions in the Third Embodiment (1) f1/L = 0.108
(2) f2/L = −0.0266
(3) f3/L = 0.0878
(4) f4/L = −0.0637
(5) f5/L = 0.0941
(6) f6/L = 0.161
(7) (r2Ff − r2Fr)/(r2Ff + r2Fr) = 1.14
(8) (r2Rf − r2Rr)/(r2Rf + r2Rr) = −1.12
(9) I/L = 3.36
(10) f22/f23 = 1.11
(11) (r5R − r6F)/(r5R + r6F) = −0.0651
(12) d56/L = 0.00477
(13) d6/r6F = 1.00
(14) (r5F − r5R)/(r5F + r5R) = 0.883
(15) f21/L = 0.254
(16) f2F/f2R = 0.967

Here, when L is the distance (object-image distance) from the object surface (reticle surface) P1 to the image surface (wafer surface) P2 and Φ is the refractive power of a lens surface in the sixth lens group $G_6$, in the above-mentioned first embodiment, 1/lΦ/ Ll=0.196 at the object-side lens surface of the positive lens $L_{61}$, 1/lΦ/Ll=0.239 at the object-side lens surface of the negative lens $L_{62}$, and 1/lΦ/Ll=0.139 at the object-side lens surface of the positive lens $L_{63}$. Thus, in the first embodiment, each lens surface satisfies the above-mentioned condition (17). In the second embodiment, 1/lΦ/Ll=0.193 at the object-side lens surface of the positive lens $L_{61}$, 1/lΦ/Ll=0.402 at the object-side lens surface of the negative lens $L_{62}$, and 1/lΦ/Ll=0.150 at the object-side lens surface of the positive lens $L_{63}$. Thus, in the second embodiment, each lens surface satisfies the above-mentioned condition (17). In the third embodiment, 1/lΦ/ Ll=0.179 at the object-side lens surface of the positive lens $L_{61}$, 1/lΦ/Ll=0.849 at the object-side lens surface of the negative lens $L_{62}$, and 1/lΦ/Ll=0.129 at the object-side lens surface of the positive lens $L_{63}$. Thus, in the third embodiment, each lens surface satisfies the condition (17).

As mentioned above, the sixth lens group $G_6$ in each embodiment is comprised of three or less lenses each having at least a lens surface satisfying the condition (17).

It is understood from the above values of items in each embodiment that each embodiment realizes preferable telecentricity on object side (reticle side) and image side (wafer side) while securing a large numerical aperture and a broad exposure area.

Next, FIGS. 7 to 10 are drawings to show various aberrations of the first embodiment of the projection optical system according to the present invention, having the lens arrangement shown in FIG. 4. Particularly, FIG. 7 is a drawing to show spherical aberration of the first embodiment. FIG. 8 a diagram to show astigmatism of the first embodiment, FIG. 9 a diagram to show distortion of the first embodiment, and FIG. 10 a diagram to show coma of the first embodiment. In these aberration diagrams of FIG. 7 to FIG. 10, NA represents the numerical aperture of the projection optical system and Y the image height. In FIG. 8 to show astigmatism, the dotted line indicates the meridional image surface and the solid line the sagittal image surface.

Similarly, FIGS. 11 to 14 are drawings to show various aberrations of the second embodiment of the projection optical system according to the present invention, having the lens arrangement shown in FIG. 5. Particularly, FIG. 11 is a diagram to show spherical aberration of the second embodiment, FIG. 12 a diagram to show astigmatism of the second embodiment, FIG. 13 a diagram to show distortion of the second embodiment, and FIG. 14 a diagram to show coma of the second embodiment. FIGS. 15 to 18 are drawings to show various aberrations of the third embodiment of the projection optical system according to the present invention, having the lens arrangement shown in FIG. 6. Particularly, FIG. 15 is a diagram to show spherical aberration of the third embodiment, FIG. 16 a diagram to show astigmatism of the third embodiment, FIG. 17 a diagram to show distortion of the third embodiment, and FIG. 18 a diagram to show coma of the third embodiment. Also in these aberration diagrams of FIGS. 11 to 18, NA represents the numerical aperture of the projection optical system and Y the image height. Further, also in the aberration diagrams shown in FIGS. 12 and 16, the dotted line indicates the meridional image surface and the solid line the sagittal image surface.

As can be understood when the aberration diagrams are compared with each other, while having a large numerical aperture and a large exposure area (image height), various kinds of aberration are corrected in a well-balanced manner in each embodiment. In particular, distortion is effectively corrected so as to approximate zero in the whole image, thereby a projection optical system having a high resolution in a wide exposure area is attained.

Here, each of the above-described embodiments show examples in which a mercury lamp supplying exposure light at i-line (365 nm) is used as a light source. Examples of the light source applicable to each embodiment further include a mercury lamp supplying exposure light at g-line (435 nm) and extreme ultraviolet ray light sources such as excimer lasers supplying light of 193 nm and 248 nm.

Also, in the foregoing embodiments, since lenses constituting the projection optical system are not bonded to each other, a problem that the bonding surfaces change over time can be avoided. While the lenses constituting the projection optical system are respectively constituted by a plurality of kinds of optical materials, they may be made of a single glass material such as quartz ($SiO_2$) when the wavelength region of the light source is not of a wide band.

Figure 19:
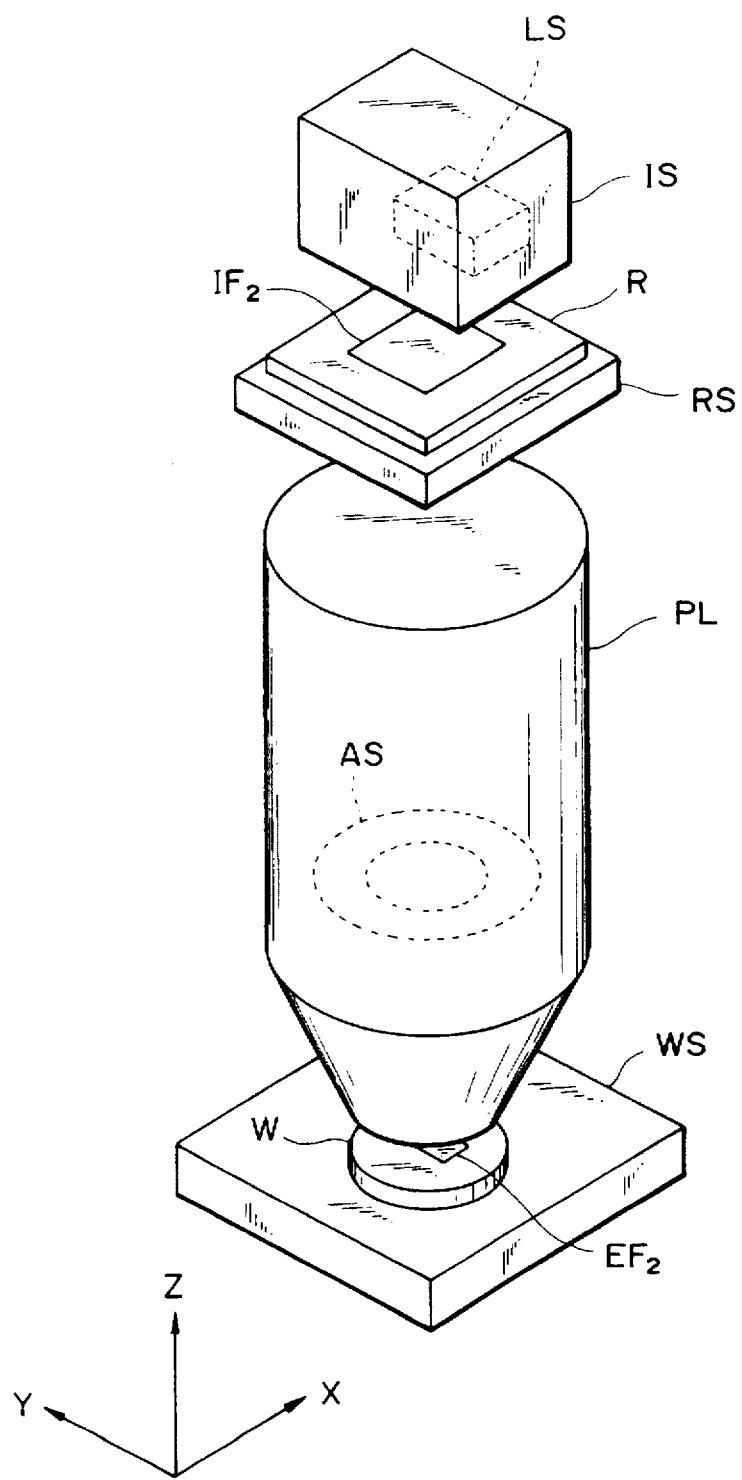
FIG. 19 is a view showing a schematic configuration of a one-shot exposure type exposure apparatus to which the projection optical system according to the present invention is applicable.

Further, the projection optical systems of the first to third embodiments are used in the scanning type exposure apparatus shown in FIG. 2. However, the projection optical system of the present invention is also applicable to a collective exposure type exposure apparatus in which patterns of a reticle R are collectively projected onto a wafer W (see FIG. 19). In FIG. 19, $IF_2$ and $EF_2$ indicate the illumination area on the reticle R and the exposure area on the wafer W, respectively.

As explained in the foregoing, according to the present invention, various kinds of aberration are corrected in a well-balanced manner and, in particular, distortion is quite effectively corrected, while a relatively large exposure area is secured and a both-side telecentric optical system is attained. Further, since high-order spherical aberration and high-order coma are sufficiently corrected while a large numerical aperture is rendered to the projection optical system, there can be attained the projection optical system having a quite favorable resolution.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.105707/1996 filed on Apr. 25, 1996 is hereby incorporated by reference.

What is claimed is:

1. A projection optical system for projecting an image of a first object onto a second object, said projection optical system comprising:

a first lens group with a positive refracting power provided between said first object and said second object;

a second lens group with a negative refracting power provided between said first lens group and said second object, said second lens group including:

a front lens with a negative refracting power disposed as closest to said first object and shaped with a concave surface to said second object, wherein when $r_{2Ff}$ is a radius of curvature of the surface of said front lens on the first object side and $R_{2Ff}$ is a radius of curvature of the surface of said front lens on the second object side, said front lens has a shape defined by the following condition:

$1.00 < (r_{2Ff} - r_{2Fr})/(R_{2Ff} + R_{2Fr}) < 5.0$;

a rear lens with a negative refracting power disposed as closest to said second object and shaped with a concave surface to said first object, wherein when $r_{2Rf}$ is a radius of curvature of the surface of said rear lens on the first object side and $r_{2Rr}$ is a radius of curvature of the surface of said rear lens on the second object side, said rear lens has a shape defined by the following condition:

$-10.0 < (r_{2Rf} - r_{2Rr})/(r_{2Rf} + r_{2Rr}) \leq -1.00$; and an intermediate lens group provided between said front lens and said rear lens, said intermediate lens group comprising:

a first intermediate lens with positive refracting power provided between said front lens and said rear lens, a second intermediate lens with a negative refracting power provided between said first intermediate lens and said rear lens, and a third intermediate lens with a negative refracting power provided between said second intermediate lens and said rear lens;

a third lens group with a positive refracting power provided between said second lens group and said second object;

a fourth lens group with a negative refracting power provided between said third lens group and said second object;

a fifth lens group with a positive refracting power provided between said fourth lens group and said second object; and a sixth lens group with a positive refracting power provided between said fifth lens group and said second object;

wherein said fifth lens group has a negative lens disposed as closest to said second object and shaped with a concave surface to said second object, wherein said sixth lens group has a lens disposed as closest to said first object and shaped with a convex surface to said first object, and wherein said first lens group has at least two positive lens, said third lens group has at least three positive lens, said fourth lens group has at least three negative lens and said sixth lens group has at least one positive lens.

2. A projection optical system according to claim 1, wherein said intermediate lens group in said second lens group has a negative refracting power.

3. A projection optical system according to claim 1, wherein said fifth lens group includes at least seven positive lenses.

4. A projection optical system for projecting an image of a first object onto a second object, said projection optical system comprising:

a first lens group with a positive refracting power provided between said first object and said second object;

a second lens group with a negative refracting power provided between said first lens group and said second object, said second lens group including:

a front lens with a negative refracting power disposed as closest to said first object and shaped with a concave surface to said second object;

a rear lens with a negative refracting power disposed as closest to said second object and shaped with a concave surface to said first object; and and intermediate lens group provided between said front lens and said rear lens, said intermediate lens group comprising:

a first intermediate lens with positive refracting power provided between said front lens and said rear lens, a second intermediate lens with a negative refracting power provided between said first intermediate lens and said rear lens, and a third intermediate lens with a negative refracting power provided between said second intermediate lens and said rear lens;

a third lens group with a positive refracting power provided between said second lens group and said second object;

a fourth lens group with a negative refracting power provided between said third lens group and said second object;

a fifth lens group with a positive refracting power provided between said fourth lens group and said second object; and a sixth lens group with a positive refracting power provided between said fifth lens group and said second object;

wherein, when $f_1$ is a focal length of said first lens group, $f_2$ is a focal length of said second lens group, $f_3$ is a focal length of said third lens group, $f_4$ is a focal length of said fourth lens group, $f_5$ is a focal length of said fifth lens group, $f_6$ is a focal length of said sixth lens group, L is a distance from said first object to said second object, $R_{2Ff}$ is a radius of curvature of the surface of the said front lens on the first object side, $r_{2Fr}$ is a radius of curvature of the surface of said front lens on the second object side, $r_{2Rf}$ is a radius of curvature of the surface of said rear lens on the first object side and $r_{2Rr}$ is a radius of curvature of the surface of said rear lens on the second object side, said projection optical system satisfies the following conditions:

$f_1/L < 0.8$
$-0.10 < f_2/L$
$0.01 < f_3/L < 1.0$
$f_4/L < -0.005$
$0.01 < f_5/L < 0.9$
$0.02 < f_6/L < 1.6$
$1.00 \leq (r_{2Ff} - r_{2Fr})/(R_{2Ff} + r_{2Fr}) < 5.0$
$-10.0 < (r_{2Rf} - r_{2Rr})/(r_{2Rf} + r_{2Rr}) \leq -1.00$, wherein said fifth lens group has a negative lens disposed as closest to said second object and shaped with a concave surface to said second object, wherein said sixth lens group has a lens disposed as closest to said first object and shaped with a convex surface to said first object, and wherein said first lens group has at least two positive lens, said third lens group has at least three positive lens, said fourth lens group has at least three negative lens and said sixth lens group has at least one positive lens.

5. A projection optical system according to claim 4, wherein when I is an axial distance from said first object to a first-object-side focal point of said entire projection optical system and L is the distance from said first object to said second object, said projection optical system satisfies the following condition:

$1.0 < I/L$.

6. A projection optical system according to claim 4, wherein said fifth lens group includes at least seven positive lenses.

7. A projection optical system according to claim 4, wherein, when $f_{22}$ is a focal length of said second intermediate lens and $f_{23}$ is a focal length of said third intermediate lens, said projection optical system satisfies the following condition:

$0.1 < f_{22}/f_{23} < 10$.

8. A projection optical system according to claim 4, wherein when $r_{5R}$ is a radius of curvature of said negative lens in said fifth lens group on the second object side and $r_{6F}$ is a radius of curvature of said lens in said sixth lens group on the first object side, said projection optical system satisfies the following condition:

$-0.90 < (r_{5R} - r_{6F})/(r_{5R} + r_{6F}) < -0.001$.

9. A projection optical system according to claim 4, wherein when $d_{56}$ is an axial distance between said fifth lens group and said sixth lens group and L is the distance from said first object to said second object, said projection optical system satisfies the following condition:

$d_{56}/L < 0.017$.

10. A projection optical system according to claim 4, wherein when $r_{6F}$ is a radius of curvature of the lens surface included in said sixth lens group and disposed as closest to said first object, and $d_6$ is an axial distance from said lens surface of said sixth lens group to said second object, said projection optical system satisfies the following condition:

$0.50 < d_6/r_{6F} < 1.50$.

11. A projection optical system according to claim 4, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, said projection optical system satisfies the following condition:

$0.30 < (r_{5F} - r_{5R})/(r_{5F} + r_{5R}) < 1.28$.

12. A projection optical system according to claim 4, wherein when $f_{21}$ is a focal length of said first intermediate lens in said intermediate lens group and L is the distance from said first object to said second object, said projection optical system satisfies the following condition:

$0.230 < f_{21}/L < 0.40$.

13. A projection optical system according to claim 4, wherein when $f_{2F}$ is a focal length of said front lens in said second lens group and $f_{2R}$ is a focal length of said rear lens in said second lens group, said projection optical system satisfies the following condition:

$0 \leq f_{2F}/f_{2R} < 18$.

14. A projection optical system according to claim 4, wherein said intermediate lens group in said second lens group has a negative refracting power.

15. A projection optical system according to claim 4, wherein said sixth lens group comprises three or less lenses each having at least one lens surface satisfying the following condition:

$1/|\Phi L| < 20$ where $\Phi$ : a refractive power of said lens surface, and

L : the object-to-image distance from said first object to said second object.

16. A projection optical system according to claim 4, wherein said projection optical system has a magnification of ¼.

17. An exposure apparatus, comprising:

a first stage allowing a mask having a predetermined pattern to be held on a main surface thereof;

a second stage allowing a photosensitive substrate to be held on a main surface thereof;

an illumination optical system fog emitting exposure light having a predetermined wavelength and transferring a predetermined pattern of said mask onto said substrate; and a projection optical system provided between said mask and said substrate, said projection optical system comprising:

a first lens group with a positive refracting power provided between said mask and said substrate;

a second lens group with a negative refracting power provided between said first lens group and said substrate, said second lens group including:

a front lens with a negative refracting power disposed as closest to said mask and shaped with a concave surface to said substrate, wherein when $R_{2Ff}$ is a radius of curvature of the surface of said front lens on the mask side and $R_{2Fr}$ is a radius of curvature of the surface of said front lens on the substrate side, said front lens has a shape defined by the following condition:

$1.00 < (r_{2Ff} - r_{2Fr})/(R_{2Ff} + R_{2Fr}) < 5.0$;

a rear lens with a negative refracting power disposed as closest to said substrate and shaped with a concave surface to said mask, wherein when $r_{2Rf}$ is a radius of curvature of the surface of said rear lens on the mask side and $r_{2Rr}$ is a radius of curvature of the surface of said rear lens on the substrate side, said rear lens has a shape defined by the following condition:

$-10.0 \leq (r_{2Rf} - r_{2Rr})/(r_{2Rf} + r_{2Rr}) \leq -1.00$; and an intermediate lens group provided between said front lens and said rear lens, said intermediate lens group comprising:

a first intermediate lens with positive refracting power provided between said front lens and said rear lens, a second intermediate lens with a negative refracting power provided between said first intermediate lens and said rear lens, and a third intermediate lens with a negative refracting power provided between said second intermediate lens and said rear lens;

a third lens group with a positive refracting power provided between said second lens group and said substrate;

a fourth lens group with a negative refracting power provided between said third lens group and said substrate;

a fifth lens group with a positive refracting power provided between said fourth lens group and said substrate; and a sixth lens group with a positive refracting power provided between said fifth lens group and said substrate;

wherein in said projection optical system, said fifth lens group has a negative lens disposed as closest to said substrate and shaped with a concave surface and said substrate.

wherein said sixth lens group has a lens disposed as closest to said mask and shaped with a convex surface to said mask, and wherein, in said projection optical system, said first lens group has at least two positive lens, said third lens group has at least three positive lens, said fourth lens group has at least three negative lens and said sixth lens group has at least one positive lens.

18. An exposure apparatus according to claim 17, wherein, in said projection optical system, said intermediate lens group in said second lens group has a negative refracting power.

19. An exposure apparatus according to claim 17, wherein, in said projection optical system, said fifth lens group includes at least seven positive lenses.

20. An exposure apparatus according to claim 17, wherein, in said projection optical system, when $f_1$ is a focal length of said first lens group, $f_2$ is a focal length of said second lens group, $f_3$ is a focal length of said third lens group, $f_4$ is a focal length of said fourth lens group, $f_5$ is a focal length of said fifth lens group, $f_6$ is a focal length of said sixth lens group and L is a distance from said mask to said substrate, said projection optical system satisfies the following conditions:

$f_1/L<0.8$ $-0.10<f_2/L$ $0.01<f_3/L<1.0$ $f_4/L<-0.005$ $0.01<f_5/L<0.9$ $0.02<f_6/L<1.6$.

21. A projection optical system according to claim 1, wherein when I is an axial distance from said first object to a first-object-side focal point of said entire projection optical system and L is the distance from said first object to said second object, said projection optical system satisfies the following condition:

$1.0<I/L$.

22. A projection optical system according to claim 21, wherein when $r_{6F}$ is a radius of curvature of the lens surface included in said sixth lens group and disposed as closest to said first object, and $d_6$ is an axial distance from said lens surface of said sixth lens group to said second object, said projection optical system satisfies the following condition:

$0.50<d_6/r_{6F}<1.50$.

23. A projection optical system according to claim 22, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, said projection optical system satisfies the following condition:

$0.30<(r_{5F}-r_{5R})/(r_{5F}+r_{5R})<1.28$.

24. A projection optical system according to claim 23, wherein $f_{33}$ is a focal length of said second intermediate lens and $f_{23}$ is a focal length of said third intermediate lens, said projection optical system satisfies the following condition:

$0.1<f_{22}/f_{23}<10$.

25. A projection optical system according to claim 24, wherein when $f_{21}$ is a focal length of said first intermediate lens in said intermediate lens group and L is the distance from said first object to said second object, said projection optical system satisfies the following condition:

$0.230<f_{21}/L<0.40$.

26. A projection optical system according to claim 21, wherein, when $f_{22}$ is a focal length of said second intermediate lens and $f_{23}$ is a focal length of said third intermediate lens, and projection optical system satisfies the following condition:

$0.1<f_{22}/f_{23}<10$.

27. A projection optical system according to claim 20, wherein when $f_{21}$ is a focal length of said first intermediate lens in said intermediate lens group and L is the distance from said first object to said second object, said projection optical system satisfies the following condition:

$0.230<f_{21}/L<0.40$.

28. A method for fabricating at least semiconductor devices or liquid crystal display devices by using a projection optical system according to claim 32, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

29. A method according to claim 28, wherein, in said exposure process, said mask and said substrate move with respect to said projection optical system, while projecting the image of the pattern on said mask onto said substrate through said projection optical system.

30. A projection optical system according to claim 1, wherein said fifth lens group includes at least seven positive lenses.

31. A projection optical system according to claim 30, wherein when I is an axial distance from said first object to a first-object-side focal point of said entire projection optical system and L is the distance from said first object to said second object, said projection optical system satisfies the following condition:

$1.0<I/L$.

32. A projection optical system according to claim 31, wherein when $r_{6F}$ is a radius of curvature of the lens surface included in said sixth lens group and disposed as closest to said first object, and $d_6$ is an axial distance from said lens surface of said sixth lens group to said second object, said projection optical system satisfies the following condition:

$0.50 < d_6/r_{6F} < 1.50$.

33. A projection optical system according to claim 32, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, said projection optical system satisfies the following condition:

$0.30 < (r_{5F} - r_{5R})/(r_{5F} + r_{5R}) < 1.28$.

34. A projection optical system according to claim 33, wherein, when $f_{22}$ is a focal length of said second intermediate lens and $f_{23}$ is a focal length of said third intermediate lens, said projection optical system satisfies the following condition:

$0.1 < f_{22}/f_{23} < 10$.

35. A projection optical system according to claim 34, wherein when $f_{21}$ is a focal length of said first intermediate lens in said intermediate lens group and L is the distance from said first objection to said second object, said projection optical system satisfies the following condition:

$0.23 < f_{21}/L < 0.40$.

36. A method for fabricating at least semiconductor devices or liquid crystal display devices by using a projection optical system according to claim 42, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

37. A method according to claim 36, wherein, in said exposure process, said mask and said substrate move with respect to said projection optical system, while projecting the image of the pattern on said mask onto said substrate through said projection optical system.

38. A projection optical system according to claim 31, wherein when $f_{22}$ is a focal length of said second intermediate lens and $f_{23}$ is a focal length of said third intermediate lens, said projection optical system satisfies the following condition:

$0.1 < f_{22}/f_{23} < 10$.

39. A projection optical system according to claim 31, wherein when $f_{21}$ is a focal length of said first intermediate lens in said intermediate lens group and L is the distance from said first object to said second object, said projection optical system satisfies the following condition:

$0.230 < f_{21}/L < 0.40$.

40. A method for fabricating at least semiconductor devices or liquid crystal display devices by using a projection optical system according to claim 1, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

41. A method according to claim 40, wherein, in said exposure process, said mask and said substrate move with respect to said projection optical system, while projecting the image of the pattern on said mask onto said substrate through said projection optical system.

42. A projection optical system according to claim 5, wherein when $r_{6F}$ is a radius of curvature of the lens surface included in said sixth lens group and disposed as closest to said first object, and $d_6$ is an axial distance from said lens surface of said sixth lens group to said second object, said projection optical system satisfies the following condition:

$0.50 < d_6/r_{6F} < 1.50$.

43. A projection optical system according to claim 42, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, and projection optical system satisfies the following condition:

$0.30 < (r_{5F} - r_{5R})/(r_{5F} + r_{5R}) < 1.28$.

44. A projection optical system according to claim 43, wherein, when $f_{22}$ is a focal length of said second intermediate lens and $f_{23}$ is a focal length of said third intermediate lens, said projection optical system satisfies the following condition:

$0.1 < f_{22}/f_{23} < 10$.

45. A projection optical system according to claim 44, wherein when $f_{21}$ is a focal length of said first intermediate lens in said intermediate lens group and L is the distance from said first object to said second object, said projection optical system satisfies the following condition:

$0.230 < f_{21}/L < 0.40$.

46. A method for fabricating at least semiconductor devices or liquid crystal display devices by using a projection optical system according to claim 42, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

47. A method according to claim 46, wherein, in said exposure process, said mask and said substrate move with respect to said projection optical system, while projecting the image of the pattern on said mask onto said substrate through said projection optical system.

48. A projection optical system according to claim 5, wherein, when $f_{22}$ is a focal length of said second intermediate lens and $f_{23}$ is a focal length of said third intermediate lens, said projection optical system satisfies the following condition:

$0.1 < f_{22}/f_{23} < 10$.

49. A projection optical system according to claim 5, wherein, when $f_{21}$ is a focal length of said first intermediate lens in said intermediate lens group and L is the distance form said first object to said second object, said projection optical system satisfies the following condition:

$0.230 < f_{21}/L < 0.40$.

50. A projection optical system according to claim 6, wherein, when I is an axial distance from said first object to a first-object-side focal point of said entire projection optical system and L is the distance from said first object to said second object, said projection optical system satisfies the following condition:

1.0<I/L.

51. A projection optical system according to claim 50, wherein when $r_6$ is a radius of curvature of the lens surface included in said sixth lens group and disposed as closest to said first object, and $d_6$ is an axial distance from said lens surface of said sixth lens group to said second object, said projection optical system satisfies the following condition:

0.50<$d_6/r_{6F}$<1.50.

52. A projection optical system according to claim 51, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, said projection optical system satisfies the following condition:

0.30<$(r_{5F}-r_{5R})/(r_{5F}+r_{5R})$<1.28.

53. A projection optical system according to claim 52, wherein, when $f_{22}$ is a focal length of said second intermediate lens and $f_{23}$ is a focal length of said third intermediate lens, said projection optical system satisfies the following condition:

0.1<$f_{22}/f_{23}$<10.

54. A projection optical system according to claim 53, wherein when $f_{21}$ is a focal length of said first intermediate lens in said intermediate lens group and L is the distance from said first object to said second object, said projection optical system satisfies the following condition:

0.230<$f_{21}/L$<0.40.

55. A method for fabricating at least semiconductor devices or liquid crystal display devices by using a projection optical system according to claim 51, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

56. A method according to claim 55, wherein, in said exposure process, said mask and said substrate move with respect to said projection optical system, while projecting the image of the pattern on said mask onto said substrate through said projection optical system.

57. A projection optical system according to claim 50, wherein, when $f_{22}$ is a focal length of said second intermediate lens and $f_{23}$ is a focal length of said third intermediate lens, said projection optical system satisfies the following condition:

0.1<$f_{22}/f_{23}$<10.

58. A projection optical system according to claim 50, wherein when $f_{21}$ is a focal length of said first intermediate lens in said intermediate lens group and L is the distance from said first object to said second object, said projection optical system satisfies the following condition:

0.23<$f_{21}/L$<0.40.

59. A method for fabricating at least semiconductor devices or liquid crystal display devices by using a projection optical system according to claim 4, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

60. A method according to claim 59, wherein, in said exposure process, said mask and said substrate move with respect to said projection optical system, while projecting the image of the pattern on said mask onto said substrate through said projection optical system.

61. An exposure apparatus according to claim 17, wherein when I is an axial distance from said first object to a first-object-side focal point of said entire projection optical system and L is the distance from said first object to said second object, said projection optical system satisfies the following condition:

1.0<I/L.

62. An exposure apparatus according to claim 61, wherein when $r_{6F}$ is a radius of curvature of the lens surface included in said sixth lens group and disposed as closest to said first object, and $d_6$ is an axial distance from said lens surface of said sixth lens group to said second object, said projection optical system satisfies the following condition:

0.50<$d_6/r_{6F}$<1.50.

63. An exposure apparatus according to claim 62, wherein said fifth lens group has a negative lens disposed as closest to said second object and shaped with a concave surface to said second object, and wherein when $r_{5F}$ is a radius of curvature of said negative lens in said fifth lens group on the first object side and $r_{5R}$ is a radius of curvature of said negative lens in said fifth lens group on the second object side, said projection optical system satisfies the following condition:

0.30<$(r_{5F}-r_{5R})/(r_{5F}+r_{5R})$<1.28.

64. An exposure apparatus according to claim 63, wherein, when $f_{22}$ is a focal length of said second intermediate lens and $f_{23}$ is a focal length of said third intermediate lens, said projection optical system satisfies the following condition:

0.1<$f_{22}/f_{23}$<10.

65. An exposure apparatus according to claim 64, wherein when $f_{21}$ is a focal length of said first intermediate lens in said intermediate lens group and L is the distance from said first object to said second object, said projection optical system satisfies the following condition:

0.230<$f_{21}/L$<0.40.

66. An exposure apparatus according to claim 17, wherein, in said exposure process, said mask and said substrate move with respect to said projection optical system, while projecting the image of the pattern on said mask onto said substrate through said projection optical system.

67. An exposure apparatus according to claim 62, wherein, in said exposure process, said mask and said substrate move with respect to said projection optical system, while projecting the image of the pattern on said mask onto said substrate through said projection optical system.

* * * * *